(12) United States Patent
Kondo et al.

(10) Patent No.: US 7,508,078 B2
(45) Date of Patent: Mar. 24, 2009

(54) ELECTRONIC DEVICE, METHOD FOR MANUFACTURING ELECTRONIC DEVICE, CONTACT HOLE OF ELECTRONIC DEVICE, METHOD FOR FORMING CONTACT HOLE OF ELECTRONIC DEVICE

(75) Inventors: Hiroshi Kondo, Kanagawa (JP); Hidenori Tomono, Kanagawa (JP); Takanori Tano, Kanagawa (JP); Hitoshi Kondoh, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 380 days.

(21) Appl. No.: 11/319,063

(22) Filed: Dec. 28, 2005

(65) Prior Publication Data

US 2006/0170836 A1  Aug. 3, 2006

(30) Foreign Application Priority Data

Jan. 6, 2005  (JP)  ............................... 2005-001771

(51) Int. Cl.
 *H01L 29/40* (2006.01)
 *H01L 21/44* (2006.01)
(52) U.S. Cl. ........................ 257/773; 257/774; 438/597; 438/672
(58) Field of Classification Search ................. 257/773, 257/774; 438/597, 672
 See application file for complete search history.

(56) References Cited

U.S. PATENT DOCUMENTS

| 5,008,732 | A | 4/1991 | Kondo et al. |
| 5,101,288 | A | 3/1992 | Ohta et al. |
| 5,153,753 | A | 10/1992 | Ohta et al. |
| 2004/0061141 | A1 | 4/2004 | Kondoh |
| 2004/0212042 | A1 | 10/2004 | Sagisaka et al. |
| 2004/0238816 | A1 | 12/2004 | Tano et al. |
| 2006/0115762 | A1 | 6/2006 | Katano et al. |
| 2006/0124925 | A1 | 6/2006 | Kondo et al. |
| 2006/0170836 | A1 | 8/2006 | Kondo et al. |
| 2007/0054212 | A1 | 3/2007 | Akiyama et al. |

FOREIGN PATENT DOCUMENTS

| JP | 5-36627 | 2/1993 |
| JP | 8-250492 | 9/1996 |
| JP | 2796575 | 7/1998 |
| JP | 11-193345 | 7/1999 |

(Continued)

OTHER PUBLICATIONS

U.S. Appl. No. 11/846,092, filed Aug. 28, 2007, Tomono et al.
U.S. Appl. No. 08/005,775, filed Jan. 19, 1993, Kameyama, et al.

*Primary Examiner*—Evan Pert
(74) *Attorney, Agent, or Firm*—Oblon, Spivak, McClelland, Maier & Neustadt, P.C.

(57) ABSTRACT

An electronic device includes a substrate, a first conductive material layer formed on the substrate, a patterning layer formed on the first conductive material layer, the patterning layer including first and second patterning layer parts having different critical surface tension, an insulation layer formed on the second patterning layer part of the patterning layer, the insulation layer including first and second insulation layer parts having different critical surface tension, and a second conductive material layer formed on the first patterning layer part and the first insulation layer part.

63 Claims, 17 Drawing Sheets

FOREIGN PATENT DOCUMENTS

| | | |
|---|---|---|
| JP | 11-193346 | 7/1999 |
| JP | 11-193347 | 7/1999 |
| JP | 2001-168191 | 6/2001 |
| JP | 2002-162630 | 6/2002 |
| JP | 3367711 | 11/2002 |
| JP | 2002-543590 | 12/2002 |
| JP | 2003-7818 | 1/2003 |
| JP | 2003-31816 | 1/2003 |
| JP | 2003-96034 | 4/2003 |
| JP | 2003-229422 | 8/2003 |
| JP | 2003-267982 | 9/2003 |
| JP | 2003-292588 | 10/2003 |
| JP | 2003-318196 | 11/2003 |
| JP | 2004-193197 | 7/2004 |
| JP | 3625196 | 12/2004 |

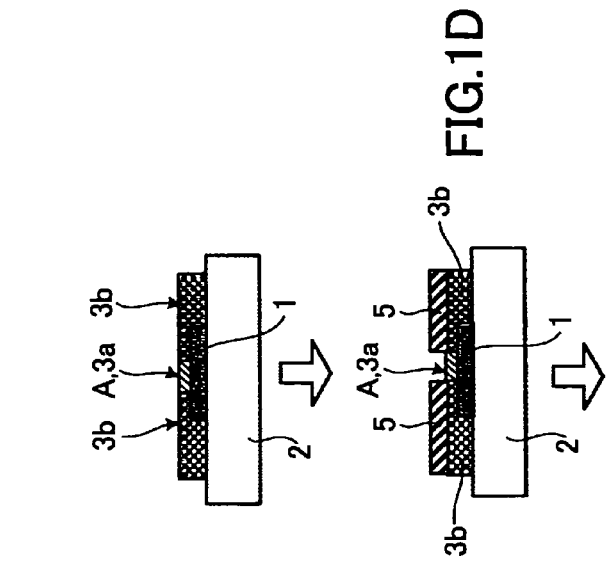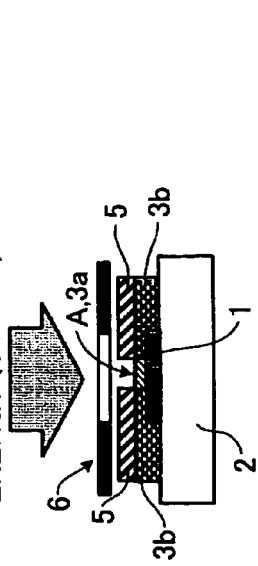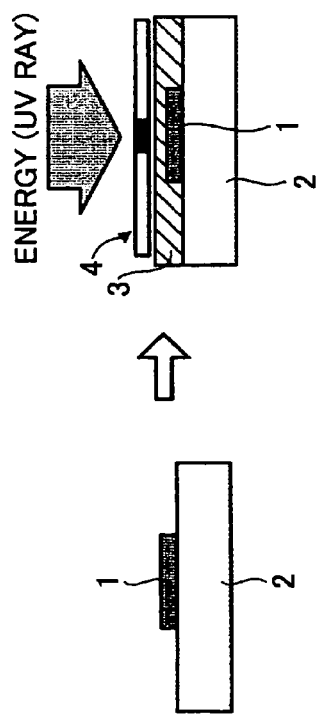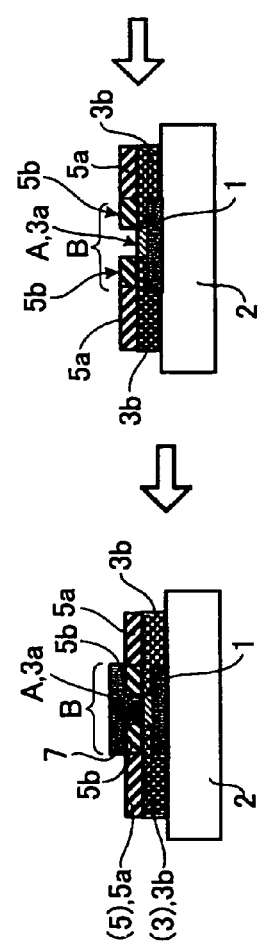

FIG.7
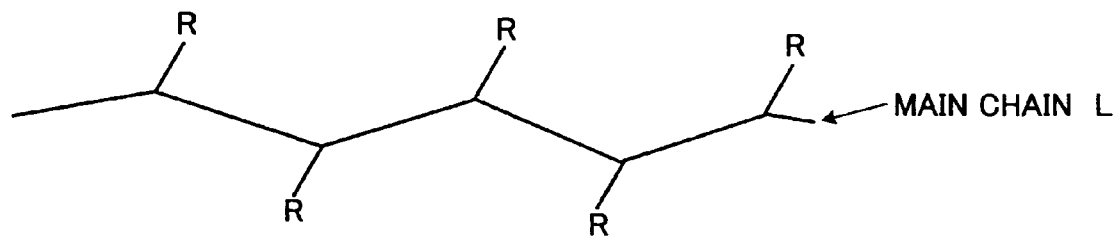
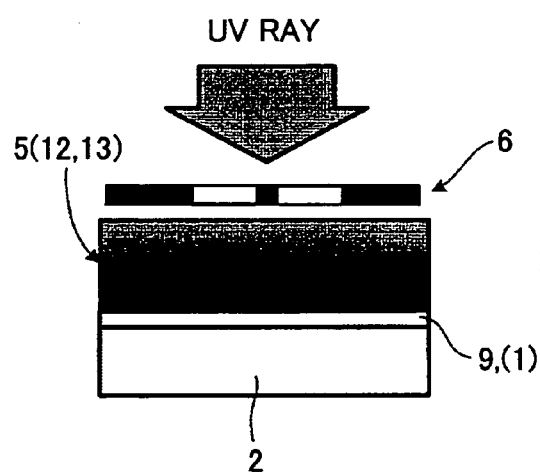
FIG.8A
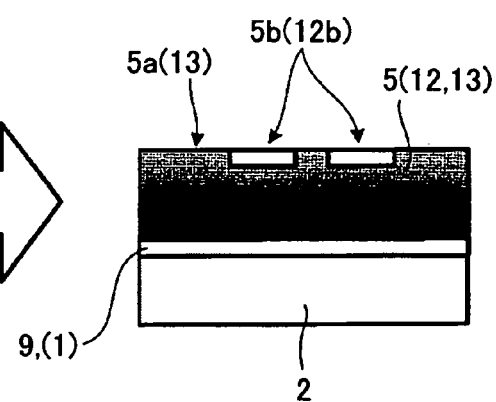
FIG.8B

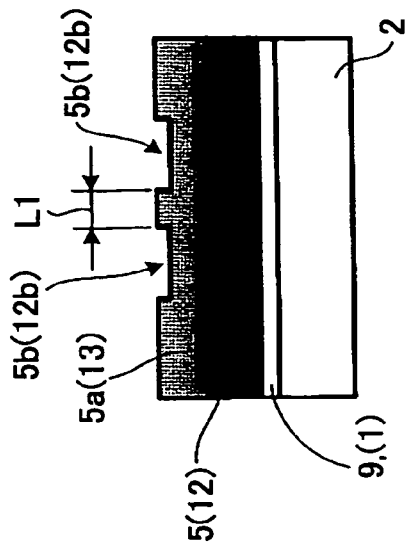
FIG.9B
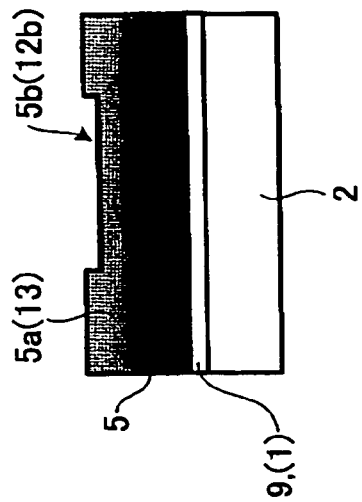
FIG.9C
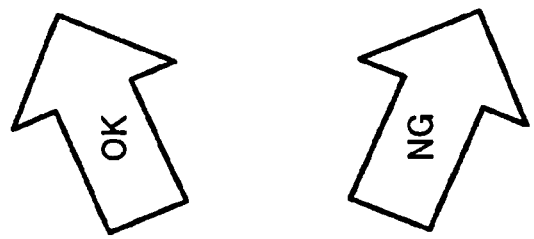
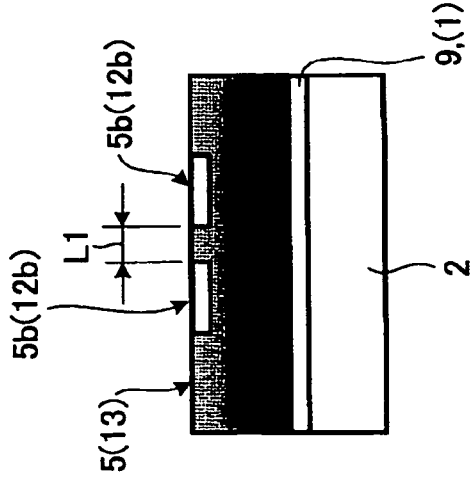
FIG.9A

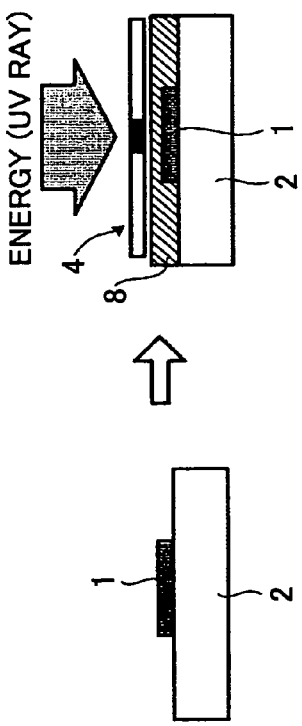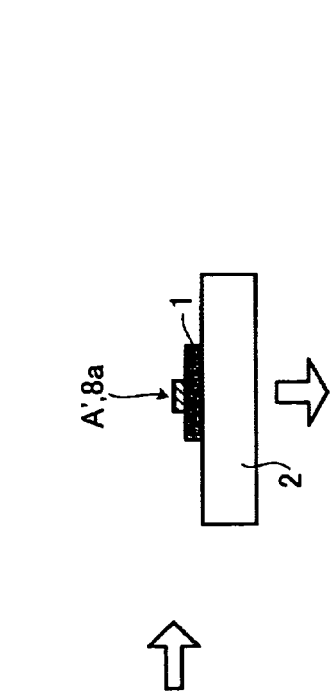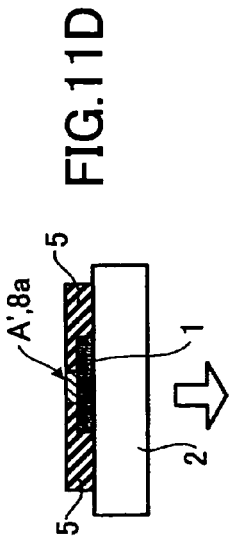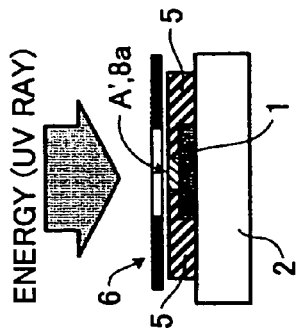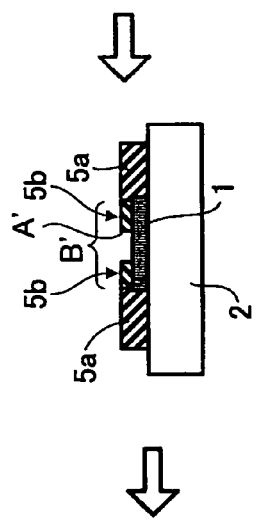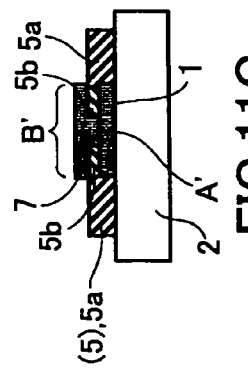

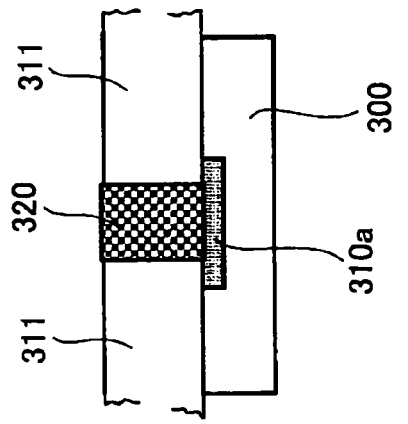
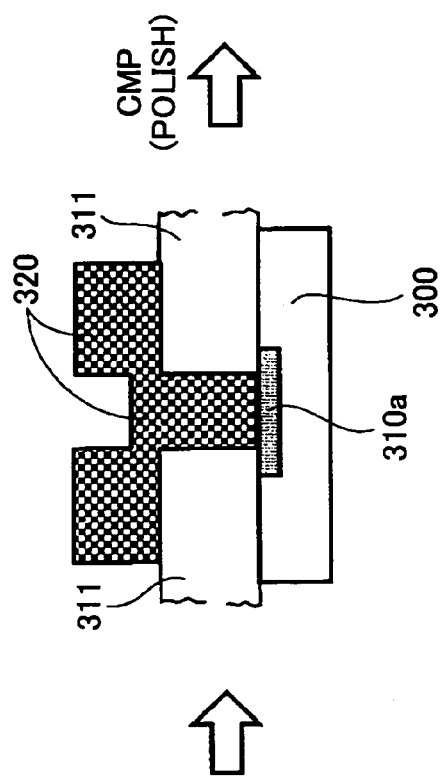
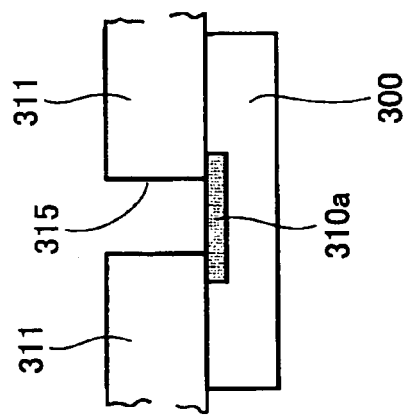

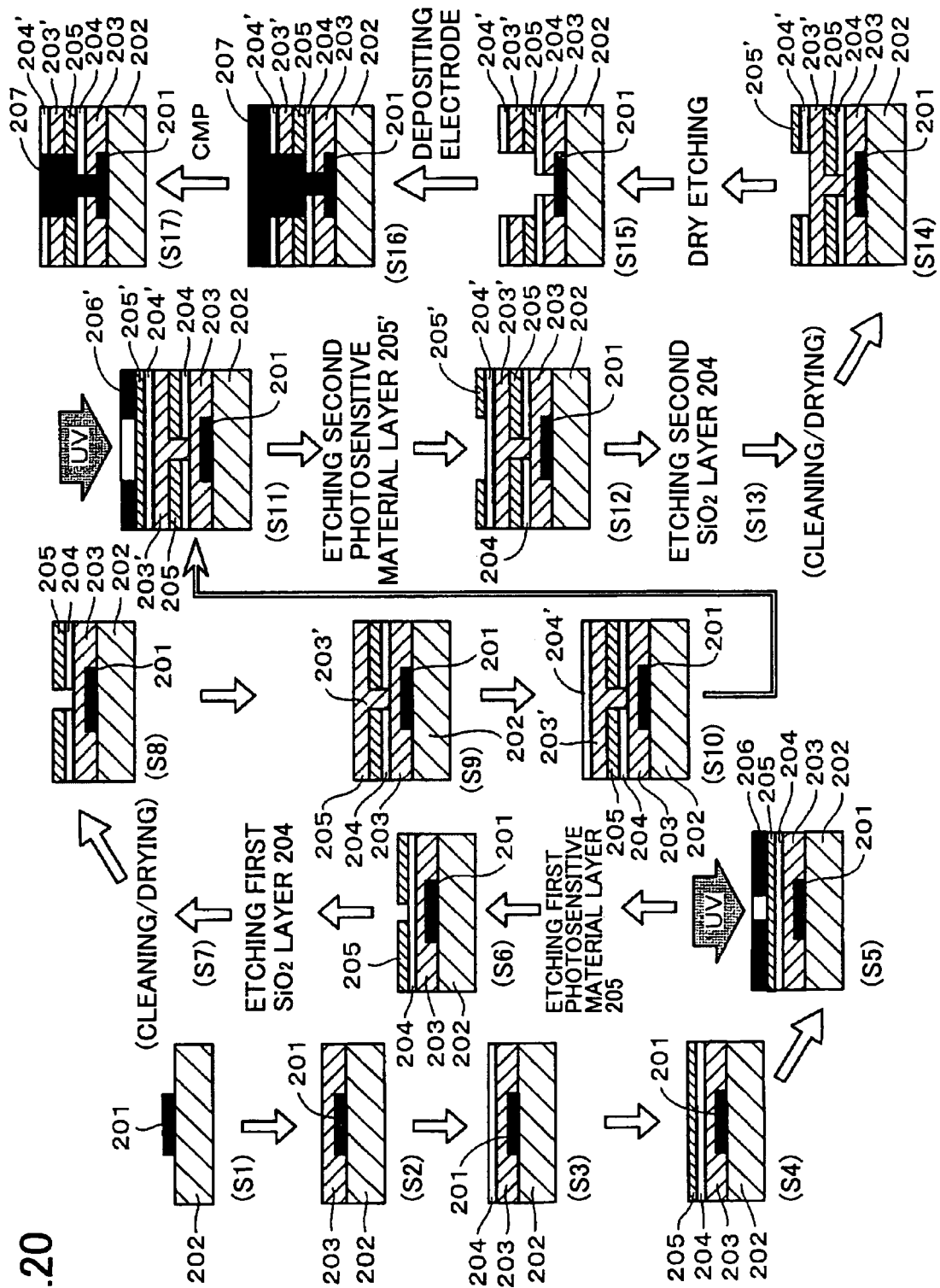

ELECTRONIC DEVICE, METHOD FOR MANUFACTURING ELECTRONIC DEVICE, CONTACT HOLE OF ELECTRONIC DEVICE, METHOD FOR FORMING CONTACT HOLE OF ELECTRONIC DEVICE

BACKGROUND OF THE INVENTION

1. Field of the Invention

The present invention generally relates to an electronic device, a method of manufacturing the electronic device, a contact hole of the electronic device, a method of forming the contact hole, a display element including the electronic device, a display device including the display element, a semiconductor arithmetic element including the electronic device, and a computer including the semiconductor arithmetic element, in which the electronic device is applicable to various electronic devices using multilayered wiring and electrodes.

2. Description of the Related Art

In recent years and continuing, the demand for fabricating electron elements with multilayer configurations and providing fine wiring technology is growing as electron elements, such as semiconductor operation elements, become highly integrated, as seen with VLSI and ULSI, for example.

FIG. 12 shows an example of a semiconductor arithmetic circuit. In FIG. 12, p-ch and n-ch exhibit a transistor using a hole transfer material and a transistor using an electron transfer material, respectively. Although the exemplary circuit shown in FIG. 12 is a NOT arithmetic circuit, multiple transistors 400 may be integrated/connected via interlayer insulating films 501, 502, 503, 504 so as to form other arithmetic circuits such as OR, NAND, NOR, and XOR. That is, as shown in FIG. 13A, fine-sized wiring electrodes 510 are formed in contact holes 511 penetrating the interlayer insulation films 502, 503, 504 in a vertical direction in FIG. 13A, and fine wiring electrodes 515 are formed extending in a horizontal direction in FIG. 13A on the interlayer insulation films 501-504 (at each interface between the interlayer insulation layers 501 and 502, the interlayer insulation layers 502 and 503, and interlayer insulation layers 503 and 504). By connecting the wiring electrodes 511 and 515 to corresponding source electrodes 403 and drain electrodes 404 shown in FIG. 13B, a highly integrated semiconductor arithmetic circuit is obtained. In the transistor 400 shown in FIG. 13B, reference numeral 401 represents a gate electrode, reference numeral 402 represents a gate insulation film, and reference numeral 405 represents a semiconductor.

In a display element 610 included in a display device 600 (e.g. reflection liquid crystal device) as shown in FIG. 14, an electron device 420, which is an active element (e.g. TFT (Thin Film Transistor), is positioned on a non-displaying side of the display device 600, and a pixel electrode 602 is formed on the interlayer insulation film 505. By applying voltage between the pixel electrode 602 and an electrode (not shown) of a transparent conductive film 603, the display element 610 displays an image(s). In order to display high definition images, the pixel electrode 602 is to be finely formed on the interlayer insulation layer 505, and the electrodes are to be connected by a contact hole 512. Furthermore, in FIG. 14, reference numeral 430 represents a first substrate, reference numeral 440 represents an electron device array having multiple electron devices 420 arranged in a prescribed array, and reference numeral 601 represents a second substrate. Furthermore, in the electron device (TFT) 420, reference numeral 411 represents a gate electrode, reference numeral 412 represents a gate insulation film, reference numeral 413 represents a source electrode, reference numeral 414 represents a drain electrode, and reference numeral 415 represents a semiconductor.

In FIG. 14, the reference numerals indicated with parenthesis (i.e. display device 60, display element 61, contact hole 62, and pixel electrode 63) are used for distinguishing an embodiment of the present invention from related art cases (described below).

It is also to be noted that the interlayer insulation films 501-505 are not only deposited/formed on an electrode (electrode material), but may also be deposited/formed on a semiconductor layer (semiconductor material) in a case where a transistor is provided as shown in FIGS. 13 and 14.

FIG. 19 is a schematic diagram showing a portion of a display device 700 for describing the forming/positioning of contact holes. In a display element 710 included in the display device 700 shown in FIG. 19, an electron device 720, which is an active element (e.g. TFT), is positioned on a non-displaying side of the display device 700, and a pixel electrode 702 (first conductive material layer) is formed on the interlayer insulation film 705. By applying voltage between the pixel electrode 702 and a transparent electrode 703, the display element 710 displays an image(s). In order to display high definition images, the pixel electrode 702 is to be finely formed on the interlayer insulation layer 705, and the pixel electrode 702 and another electrode 704 (i.e. first conductive material layer and second conductive material layer) are to be connected by a contact hole 712. In FIG. 19, reference numeral 701 represents a substrate for forming, for example, an electron element 720 thereon, reference numeral 704 represents a second conductive material layer, and reference numeral 706 (i.e. the portion illustrated with broken lines) represents a retention volume. It is to be noted that the electron element 720 has a substantially similar configuration as that of the electron element 420 (TFT) shown in FIG. 13.

As a typical method for forming fine electrodes, there is a photolithography process "A" including the steps of (1)-(7) as described below.

(1) Apply photo-resist on a substrate having a thin film layer (Step of applying resist coating).

(2) Remove solvent by heating (Step of pre-baking).

(3) Irradiate ultraviolet light with use of a hard mask lithographed by a laser beam or an electron beam in accordance with prescribed pattern data (Step of exposing)

(4) Remove resist of exposed portion by using an alkali solution (Step of developing)

(5) Cure resist of unexposed portion (patterned portion) by heating (Step of post-baking)

(6) Remove a portion of the thin film layer having no resist by steeping into an etching liquid or exposing to an etching gas (Step of etching)

(7) Remove resist by using an alkali solution or an oxygen radical (Step of removing resist)

This typical method, however, requires many steps, and results in an increase of manufacturing cost.

In order to resolve this problem, a related art case discloses a method including the steps of applying organo-cycloxane onto a plane on which an electrode is formed (electrode formation plane), performing hydrophilization on a portion where the electrode is disposed by using UV exposing process, and applying a conductive ink (e.g. ultra fine particles of colloidal gold liquid or PEDOT solution) by using an inkjet method. Accordingly, in a case where the electrode formation plane is situated on an interlayer insulation film, fine electrode patterns can be formed by performing this method that is easier than the above-described photolithography process "A".

Another related art case discloses a method for forming contact holes which is also easier than the above-described photolithography process "A". This related case is described below with reference to FIGS. 15A-15C.

FIGS. 15A-15C show a first wiring layer 310, an interlayer insulation layer 311, a photosensitive silazane layer 312, and light beams 313. The first wiring layer 310 includes a wiring 310a for mutually connecting various functional blocks of a semiconductor device, and an interlayer insulation film 310b for conducting insulation among wirings, and a protection film 310c for preventing wiring material of the wiring 310a from diffusing to the interlayer insulation layer 311.

The interlayer insulation layer 311 is a layer for conducting insulation among wirings. The photosensitive silazane layer 312 includes a film formed of a photosensitive silazane. The photosensitive silazane includes an MSZ (Methylsilazane) having a positive photosensitivity by adding a photo-oxide generating material and a sensitizing agent thereto. The photosensitive silazane layer 312 is subjected to a process of irradiation electron beams or ultraviolet beams for generating photo-oxide (H+) therein, cutting-off an Si—N bond in the MSZ, and absorbing $H_2O$. Then, the photosensitive silazane layer 312 is subjected to a process of developing with a TMAH (Tetra-Methyl-Ammonium-Hydroxide) solution, so as to etch the exposed portion of the photosensitive silazane layer 312. Then, the photosensitive silazane layer 312 is subjected to a heating process in which the photosensitive silazane layer 322 is cured in an $N_2$ ambient atmosphere of approximately 400° C. Thereby, the MSZ of the photosensitive silazane layer transforms into MSQ (Methyl silsesquiaxane) having no photodecomposition property. Accordingly, the photosensitive silazane layer 312 can serve as an etch-stop layer.

The light beams 313 shown in FIG. 15 irradiated to the photosensitive silazane layer 312 may be electron beams or ultraviolet beams. Although not shown in FIGS. 15A-15C, the first wiring layer 310 is formed as a wiring for connecting with, for example, a prescribed MOS transistor formed on a silicon substrate.

More specifically, the interlayer insulation layer 311 is, first, formed on an upper surface of the first wiring layer 310 as shown in FIG. 15A. Since the interlayer insulation layer 311 serves as an insulation layer to which contact holes or wiring grooves are formed in a subsequent process, the thickness of the interlayer insulation layer 311 is same as the depth of the contact holes or no less than the depth of the wiring grooves. Then, the photosensitive silazane layer 312 is formed on an upper surface of the interlayer insulation layer 311.

Next, as shown in FIG. 15B, the light beams 313 are irradiated to the photosensitive silazane layer 312. In this process, the light beams 313 are irradiated to the photosensitive silazane layer 312 via a mask having a pattern of the contact holes or the wiring grooves that are to be formed in the interlayer insulation layer 311. Then, the portion of the photosensitive silazane layer 312 exposed by the irradiation is subjected to a developing process using a TMAH solution, so that the exposed portion can be removed to form a prescribed pattern. Then, by performing a heating process on the photosensitive silazane layer 312 in an $N_2$ ambient atmosphere of 400° C., the MSZ of the photosensitive silazane layer 312 is transformed to MSQ. Thereby, the photosensitive silazane layer 312 can be an etch-stop layer.

Next, as shown in FIG. 15C, the contact holes or the wiring grooves are formed by etching the interlayer insulation layer 311 and further etching the protection film 310c of the first wiring layer 310.

An exemplary process of forming the contact holes, the wiring grooves, or the wirings by using a CMP (Chemical Mechanical Polishing) method is described with reference to FIGS. 16A-16C. In FIGS. 16A-16C, reference numeral 300 represents a semiconductor substrate serving as the first wiring substrate 310 including the wiring 310a, and reference numeral 315 represents a contact hole or a wiring groove. It is to be noted that the protection film 310c is omitted for the sake of convenience. With reference to FIGS. 16A-16C, first, a barrier metal is applied for preventing metal from diffusing into a semiconductor substrate 300. Then, a copper material, for example, is filled into a contact hole (wiring groove) 315, so as to form an upper electrode 320. Then, the CMP method is performed for polishing away excess copper material. Thereby, the contact hole 315, the upper electrode 320, and other wirings can be formed. By repeating this process for a given number of times, multiple layers of wiring can be formed, to thereby obtain a semiconductor device having a multilayer wiring structure.

Meanwhile, in other related art cases, an organic material is proposed to be used as a semiconductor material owing to its manufacturing advantages, such as low manufacture cost and large-area applicability as well as its possibility of realizing functions not achieved with inorganic materials. For example, as shown in Japanese Laid-Open Patent Application No. 7-86600, a field-effect transistor using an organic material having a carrier mobility that changes in correspondence with outside physical stimulus (e.g. light, heat). In another related art case, Japanese Laid-Open Patent Application No. 2003-318196 also proposes a field-effect transistor using an organic semiconductor material.

In another related art case, $SiO_2$ is used as the material of the interlayer insulation film (interlayer insulation film), such as in Japanese Laid-Open Patent Application No. 5-36627.

In another related art case, a method of forming via holes (contact holes)/interlayer insulation films by using a photolithography process is disclosed in Japanese Laid-Open Patent Application No. 2001-168191, for example. This method is employed in manufacturing semiconductor devices and is a type of dual damascene method applied to semiconductor products. The main processes of this method are described below with reference to FIG. 20.

(1) Forming a first conductive material layer 201 on a substrate 202
(2) Forming a first organic insulation material layer 203 on the first conductive material layer 201 and the substrate 202
(3) Forming a first $SiO_2$ layer 204 on the first organic insulation material layer 203
(4) Forming a first photosensitive material layer 205 on the first $SiO_2$ layer 204
(5) Forming a pattern (i.e. patterning) of a contact hole by irradiating UV via a first exposure mask 206
(6) Etching the first photosensitive material layer 205
(7) Etching the $SiO_2$ layer 204
(8) Cleaning/Drying
(9) Depositing/Forming a second organic insulation material layer 203'
(10) Forming a second $SiO_2$ layer 204' on the second organic insulation material layer 203'
(11) Forming a pattern (i.e. patterning) of a second conductive material layer 207 by irradiating UV via a second exposure mask 206'
(12) Etching the second photosensitive material layer 205'
(13) Etching the second $SiO_2$ layer 204'
(14) Cleaning/Drying
(15) Removing thin film of the second organic insulation material layer 203' by dry-etching
(16) Forming the second conductive material layer 207
(17) CMP In another related art case, a method of forming a pattern on an insulation material by utilizing the difference of wettability is disclosed in Japanese Laid-Open Patent Application No. 2004-193197. In the method, an interlayer insulation film is formed by patterning an insulation material by changing the adhesion of the substrate with use of UV.

However, the related art case shown in Japanese Laid-Open Patent Application No. 2002-261048 requires the steps of applying a coating of insulation material on a substrate, applying a coating of organo-siloxane on the substrate, and exposing the substrate, since organo-siloxane itself does not have an insulating property. Accordingly, in a case of fabricating a multilayer configuration, an increase of steps for forming a single layer causes an increase of steps for the entire process of fabricating the multilayer configuration.

In the related art case shown in Japanese Laid-Open Patent Application No. 2003-7818 (Method of forming upper electrode by using Chemical Mechanical Polishing (CMP) as shown in FIGS. 15 and 16), it is difficult to provide a flat shape for the upper electrode 320 owing that the vicinity of the center portion of the upper electrode 320 is susceptible to being formed into a U-shape or into an inclined shape (See FIGS. 17 and 18). It is desired that the upper electrode 320 is formed having a shape as shown in FIG. 16C (shape resulting from the chemical mechanical polishing process). Therefore, it is difficult to attain satisfactory and reliable electric connection of electrodes.

In the related art case shown in Japanese Laid-Open Patent Application No. 2003-7818, although the disclosed method may be a simple method for forming the contact hole 315, the method still requires the processes of etching the interlayer insulation layer 311 and etching the protection film 310c of the first wiring layer 310. These required processes result in increase of manufacturing cost. Furthermore, since the method requires heating under a high temperature of 400° C., the materials to be used for the substrate, for example, is limited. These disadvantages are also found in the related art case shown in Japanese Laid-Open Patent Application No. 2003-318196.

In the related art case shown in Japanese Laid-Open Patent Application No. 7-86600, the organic semiconductor material layer may be damaged in a case where an interlayer insulation film is deposited by using an organic solution having little polarity (e.g. toluene, THF, xylene).

In the related art case shown in Japanese Laid-Open Patent Application No. 5-36627, although $SiO_2$ is a reliable material for the interlayer insulation film material (owing to its high dielectric voltage), the use of $SiO_2$ as the interlayer insulation film material increases manufacture cost since a vacuum deposition process (e.g. sputtering) is necessary for depositing/forming such interlayer insulation film.

This disadvantage is also found in a case of using materials such as $Si_3N_4$ and SiON. Accordingly, a material which has high dielectric voltage and which can be applied by a coating process (e.g. sputtering) is desired. Furthermore, the parasitic capacitance of the interlayer insulation film, which causes wiring delay, is required to be reduced. Since such wiring delay causes a decrease in operational frequency of semiconductor arithmetic elements (e.g. LSI), a material having a dielectric constant less than that of $SiO_2$ (less than $\epsilon=3.9$) is desired.

In the related art case shown in Japanese Laid-Open Patent Application No. 2001-168191, although fine patterning results can be achieved by forming the contact hole/interlayer insulation film with use of the photolithography process, such method requires many processes as shown in FIG. 20 and results in the increase of manufacture cost. The CMP process in this method (process (17) in FIG. 20) is the same as the CMP process shown in FIGS. 16(a)-(c). Accordingly, as described above, it is difficult to provide a flat shape for the upper electrode 320 owing that the vicinity of the center portion of the upper electrode 320 is susceptible to being formed into a U-shape or into an inclined shape (See FIGS. 17 and 18). Therefore, it is difficult to attain satisfactory and reliable electric connection of electrodes.

In the related art case shown in Japanese Laid-Open Patent Application No. 2004-193197, the method for patterning the insulation material also requires many complicated processes since it also uses the photolithography process for forming electrodes on the insulation film.

SUMMARY OF THE INVENTION

It is a general object of the present invention to provide an electronic device, a method of manufacturing an electronic device, a contact hole of an electronic device, a method of forming a contact hole of an electronic device, a display element, a display device, a semiconductor arithmetic element, and a computer that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by an electronic device, a method of manufacturing an electronic device, a contact hole of an electronic device, a method of forming a contact hole of an electronic device, a display element, a display device, a semiconductor arithmetic element, and a computer particularly pointed out in the specification in such full, clear, concise, and exact terms as to enable a person having ordinary skill in the art to practice the invention.

To achieve these and other advantages and in accordance with the purpose of the invention, as embodied and broadly described herein, the present invention provides an electronic device including: a substrate; a first conductive material layer formed on the substrate; a patterning layer formed on the first conductive material layer, the patterning layer including first and second patterning layer parts having different critical surface tension; an insulation layer formed on the second patterning layer part of the patterning layer, the insulation layer including first and second insulation layer parts having different critical surface tension; and a second conductive material layer formed on the first patterning layer part and the first insulation layer part.

Furthermore, the present invention provides a display element including the electronic device according to an embodiment of the present invention.

Furthermore, the present invention provides a display device including the display element according to an embodiment of the present invention.

Furthermore, the present invention provides a semiconductor arithmetic element including the electronic device according to an embodiment of the present invention.

Furthermore, the present invention provides a computer including the electronic device according to an embodiment of the present invention.

Furthermore, the present invention provides a method of manufacturing an electronic device, the method including the steps of: a) forming a first conductive material layer on a substrate; b) forming a patterning layer on the first conductive material layer by applying a first coating material to the first conductive material layer; c) forming first and second patterning layer parts having different critical surface tension in the patterning layer, the first and second patterning layer parts in the patterning layer being formed by applying energy to the patterning layer; d) forming an insulation layer on the first conductive material layer by applying a second coating material to the patterning layer; e) forming first and second insulation layer parts having different critical surface tension in the insulation layer, the first and second insulation layer parts in the insulation layer being formed by applying the energy to the insulation layer; and f) forming a second conductive material layer on the first patterning layer part and the first insulation layer part.

Furthermore, the present invention provides a method of forming a contact hole for an electronic device, the method including the steps of: a) forming a first conductive material layer on a substrate; b) forming a patterning layer on the first conductive material layer by applying a first coating material to the first conductive material layer; c) forming first and second patterning layer parts having different critical surface tension in the patterning layer, the first and second patterning layer parts in the patterning layer being formed by applying energy to the patterning layer; d) forming an insulation layer on the first conductive material layer by applying a second coating material to the patterning layer; and e) forming first and second insulation layer parts having different critical surface tension in the insulation layer, the first and second insulation layer parts in the insulation layer being formed by applying the energy to the insulation layer.

Furthermore, the present invention provides a contact hole of an electronic device, the contact hole formed by a process including the steps of: a) forming a first conductive material layer on a substrate; b) forming a patterning layer on the first conductive material layer by applying a first coating material to the first conductive material layer; c) forming first and second patterning layer parts having different critical surface tension in the patterning layer, the first and second patterning layer parts in the patterning layer being formed by applying energy to the patterning layer; d) forming an insulation layer on the first conductive material layer by applying a second coating material to the patterning layer; and e) forming first and second insulation layer parts having different critical surface tension in the insulation layer, the first and second insulation layer parts in the insulation layer being formed by applying the energy to the insulation layer.

Furthermore, the present invention provides an electronic device including: a substrate; a first conductive material layer formed on a substrate; a removable patterning layer formed on the first conductive material layer, the removable patterning layer including a removable patterning layer part having a critical surface tension different from that of the first conductive material layer; an insulation layer formed on the first conductive material layer except for a part of the first conductive material layer on which the removable patterning layer part is formed, the insulation layer including first and second insulation layer parts having different critical surface tension; and a second conductive material layer formed on the removable patterning layer part and the first insulation layer part.

Furthermore, the present invention provides a method of manufacturing an electronic device, the method including the steps of: a) forming a first conductive material layer on a substrate; b) forming a removable patterning layer on the first conductive material layer by applying a first coating material to the first conductive material layer; c) forming a removable patterning layer part in the removable patterning layer by applying energy to the removable patterning layer, the removable patterning layer part having a critical surface tension different from that of the first conductive material layer; d) forming an insulation layer on the first conductive material layer except for a part of the first conductive material layer on which the removable patterning layer part is formed by applying a second coating material to the first conductive material layer; e) removing the removable patterning layer part and forming first and second insulation layer parts in the insulation layer by applying the energy to the removable patterning layer part and the insulation layer, the first and second insulation layer parts having different critical surface tension; and f) forming a second conductive material layer on the first conductive material layer and the first insulation layer part.

Furthermore, the present invention provides a method for forming a contact hole of an electronic device, the method including the steps of: a) forming a first conductive material layer on a substrate; b) forming a removable patterning layer on the first conductive material layer by applying a first coating material to the first conductive material layer; c) forming a removable patterning layer part in the removable patterning layer by applying energy to the removable patterning layer, the removable patterning layer part having a critical surface tension different from that of the first conductive material layer; d) forming an insulation layer on the first conductive material layer except for a part of the first conductive material layer on which the removable patterning layer part is formed by applying a second coating material to the first conductive material layer; and e) removing the removable patterning layer part and forming first and second insulation layer parts in the insulation layer by applying the energy to the removable patterning layer part and the insulation layer, the first and second insulation layer parts having different critical surface tension.

Furthermore, the present invention provides a contact hole of an electronic device formed by a process including the steps of: a) forming a first conductive material layer on a substrate; b) forming a removable patterning layer on the first conductive material layer by applying a first coating material to the first conductive material layer; c) forming a removable patterning layer part in the removable patterning layer by applying energy to the removable patterning layer, the removable patterning layer part having a critical surface tension different from that of the first conductive material layer; d) forming an insulation layer on the first conductive material layer except for a part of the first conductive material layer on which the removable patterning layer part is formed by applying a second coating material to the first conductive material layer; and e) removing the removable patterning layer part and forming first and second insulation layer parts in the insulation layer by applying the energy to the removable patterning layer part and the insulation layer, the first and second insulation layer parts having different critical surface tension.

Furthermore, the present invention provides an electronic device including: a substrate; a first conductive material layer formed on a substrate; a removable patterning layer formed on the first conductive material layer, the patterning layer including a removable patterning layer part having a critical surface tension different from that of the first conductive material layer; an insulation layer formed on the first conductive material layer except for a part of the first conductive material layer on which the removable patterning layer part is formed; a low surface energy layer formed on the insulation layer and the removable layer part; the low surface energy layer including a target removal area; and a second conductive material layer formed on a predetermined area of the removable patterning layer part and the insulation layer that corresponds to the target removal area of the low surface energy layer.

Furthermore, the present invention provides a method of manufacturing an electronic device, the method including the steps of: a) forming a first conductive material layer on a substrate; b) forming a removable patterning layer on the first conductive material layer by applying a first coating material to the first conductive material layer; c) forming a removable patterning layer part in the removable patterning layer by applying energy to the removable patterning layer, the removable patterning layer part having a critical surface tension different from that of the first conductive material layer; d) forming an insulation layer on the first conductive material layer except for a part of the first conductive material layer on which the removable patterning layer part is formed by applying a second coating material to the first conductive material layer; e) forming a low surface energy part on the insulation layer and the removable patterning layer part, the low surface energy part including a target removal area; f) removing the removable patterning layer part and the target removal area by applying the energy to the removable patterning layer part and the target removal area; and g) forming a second conductive material layer on a predetermined area of the removable patterning layer part and the insulation layer that corresponds to the target removal area of the low surface energy layer.

Furthermore, the present invention provides a method for forming a contact hole of an electronic device, the method including the steps of: a) forming a first conductive material layer on a substrate; b) forming a removable patterning layer on the first conductive material layer by applying a first coating material to the first conductive material layer; c) forming a removable patterning layer part in the removable patterning layer by applying energy to the removable patterning layer, the removable patterning layer part having a critical surface tension different from that of the first conductive material layer; d) forming an insulation layer on the first conductive material layer except for a part of the first conductive material layer on which the removable patterning layer part is formed by applying a second coating material to the first conductive material layer; e) forming a low surface energy part on the insulation layer and the removable patterning layer part, the low surface energy part including a target removal area; and f) removing the removable patterning layer part and the target removal area by applying the energy to the removable patterning layer part and the target removal area.

Furthermore, the present invention provides a contact hole of an electronic device formed by a process including the steps of: a) forming a first conductive material layer on a substrate; b) forming a removable patterning layer on the first conductive material layer by applying a first coating material to the first conductive material layer; c) forming a removable patterning layer part in the removable patterning layer by applying energy to the removable patterning layer, the removable patterning layer part having a critical surface tension different from that of the first conductive material layer; d) forming an insulation layer on the first conductive material layer except for a part of the first conductive material layer on which the removable patterning layer part is formed by applying a second coating material to the first conductive material layer; e) forming a low surface energy part on the insulation layer and the removable patterning layer part, the low surface energy part including a target removal area; f) removing the removable patterning layer part and the target removal area by applying the energy to the removable patterning layer part and the target removal area; and g) forming a second conductive material layer on a predetermined area of the removable patterning layer part and the insulation layer that corresponds to the target removal area of the low surface energy layer.

Other objects and further features of the present invention will be apparent from the following detailed description when read in conjunction with the accompanying drawings.

BRIEF DESCRIPTION OF THE DRAWINGS

FIGS. 1A-1G are schematic drawings for describing a process for manufacturing an electronic device and for forming a contact hole according to an embodiment of the present invention;

FIG. 7 is a schematic drawing showing a chemical configuration of a material included in a wettability changing insulation layer according to an embodiment of the present invention;

FIGS. 8A-8B are schematic drawings for describing formation of patterns (patterning) of low and high surface energy parts on a surface of a wettability changing insulation layer by irradiating UV ray according to an embodiment of the present invention;

FIGS. 9A-9C are schematic drawings for describing the relation of electrodes and patterns of high and low surface energy parts of a wettablity changing insulation layer according to an embodiment of the present invention;

FIGS. 11A-11G are schematic drawings for describing a process for manufacturing an electronic device and for forming a contact hole according to another embodiment of the present invention;

FIGS. 16A-16C are schematic drawings for describing contact holes, wiring, wiring electrodes according to a related art;

FIG. 20 are schematic drawings for describing a process for manufacturing an electronic device and for forming a contact hole according to a related art.

DESCRIPTION OF THE PREFERRED EMBODIMENTS

Figure 2:
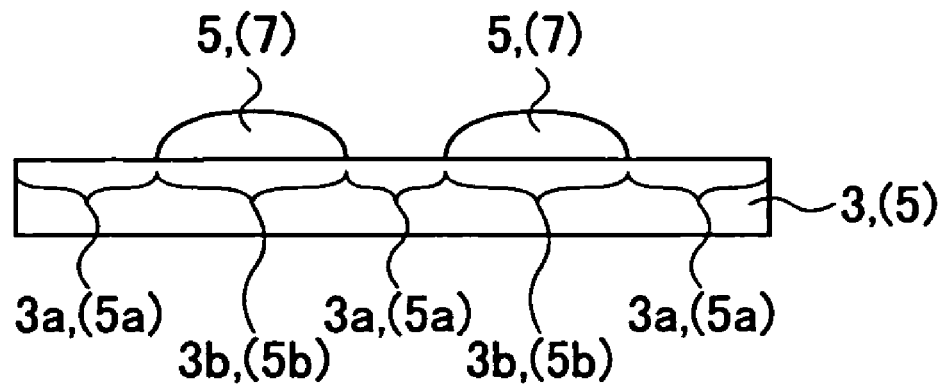
FIG. 2 is a schematic drawing for describing the difference of critical surface tension between a low surface energy part and high surface energy part in a patterning layer and an insulation layer (wettability changing insulation layer) according to an embodiment of the present invention.

In the following, embodiments of the present invention are described with reference to the accompanying drawings.

FIRST EMBODIMENT

A method of manufacturing an electronic device and a configuration of an electronic device manufactured by the method according to the first embodiment of the present invention are described with reference to FIGS. 1A-1G.

First, a first conductive material layer 1 is formed by depositing/forming a first conductive material on a substrate 2 (See FIG. 1A). Then, a patterning layer 3, which is formed of a material having a changing critical surface tension, is selectively deposited/formed on the first conductive material layer 1 by applying energy (e.g. UV rays) thereto (See FIG. 1B) Then, a first portion A of the patterning layer 3 (i.e. low surface energy part 3a), which has a critical surface tension that is different from that of other portions of the patterning layer 3 (i.e. high surface energy part 3b), is formed at the part where the first conductive material layer 1 electrically contacts a second conductive material layer 7 (described below) (See FIG. 1C). Then, a wettability changing insulation layer 5, which is a material layer having a function of changing its critical surface tension when applied by energy (e.g. UV rays) and a function of insulating, is formed/deposited on the patterning layer 3 except for the first portion A (See FIG. 1D). Then, by applying energy (e.g. UV rays) to a portion of the wettability changing insulation layer 5 (See FIG. 1E), a second portion B (i.e. high surface energy part 5b), which has a critical surface tension that is different from that of other portions of the wettability changing insulation layer 5 (i.e. low surface energy part 5a), is formed in communication with the first portion A (See FIG. 1F). Then, the second conductive material layer 7, which is formed of a second conductive material, is formed on the second portion B (See FIG. 1G). Thereby, the first conductive material layer 1 and the second conductive material layer 7 are electrically connected only at the first portion A in a state where the wettability changing insulation layer 5 (including the low surface energy portion 5a and the high surface energy portion 5b) serving as an insulation material layer is disposed therebetween. Furthermore, it may be said that the above-described method of manufacturing an electronic device according to the first embodiment of the present invention (as shown in FIGS. 1A-1G) is also a method of forming a contact hole, in which the contact hole formed by the method enables the first conductive material layer 1 and the second conductive material layer 7 to electrically connect only at the first portion A in a state having the wettability changing insulation layer 5 disposed therebetween.

Accordingly, as shown in FIGS. 1A-1G, the electronic device manufactured by the above-described method according to the first embodiment of the present invention includes the first conductive material layer 1, the patterning layer 3 having the low surface energy part 3a (first portion A) and the high surface energy part 3b provided on the first conductive layer 1, the wettability changing insulation layer 5 having the low surface energy part 5a and the high surface energy part 5b provided on the patterning layer 3, and the second conductive material layer 7 provided on the wettability changing insulation layer 5 (at least on the second portion B). In the electronic device according to the first embodiment of the present invention, the first conductive material layer 1 and the second conductive material layer 7 are electrically connected only at the first portion A in a state where the wettability changing insulation layer 5 serving as the insulation material layer is disposed therebetween.

Next, the processes and materials used in the above-described method according to the first embodiment of the present invention are described in more detail.

First, as shown in FIG. 1A, the first conductive material layer 1, being formed of a conductive material, is provided on the substrate 2. The substrate 2 may include, for example, a glass material, a plastic material (e.g. polycarbonate, polyacrylate, polyether sulfone), a silicon wafer, and/or a metal material. The method for depositing/forming the first conductive material layer 1 on the substrate 2 includes, for example, applying/coating a liquid containing a conductive material. This simplifies the process of manufacturing an electronic device having a fine configuration. The method for applying the liquid containing a conductive material includes, for example, a printing method (e.g. a surface printing method, a relief printing method, an intaglio printing method, a stencil printing method).

The liquid including the conductive material may include, for example, metal materials such as chromium (Cr), tantalum (Ta), titanium (Ti), copper (Cu), aluminum (Al), molybdenum (Mo), tungsten (W), nickel (Ni), gold (Au), palladium (Pd), platinum (Pt), silver (Ag), and/or tin (Sn). Alternatively, the liquid including the conductive material may include, for example, at least one type of conductive polymer among (1) a conductive polymer of a polyacetylene group, a conductive polymer of a polyphenylene group (e.g. polyparaphenylene and a derivative thereof, polyphenylenevinylene and a derivative thereof), (2) a conductive polymer of a heterocyclic group (e.g. polypyrrole and a derivative thereof, polythiophene, polyethylenedioxythiophene and a derivative thereof, polyfuran and a derivative thereof), and (3) an ionic conductive polymer (e.g. polyaniline and a derivative thereof) that is dispersed or dissolved in a solvent.

An example of a device having the first conductive material layer deposited/formed thereto may be a source electrode/drain electrode of a transistor serving as a semiconductor arithmetic element or a pixel electrode of a display element included in a display device.

Then, as shown in FIG. 1B, the patterning layer 3, which has its critical surface tension changed by application of energy (e.g. UV ray), is selectively deposited/formed on the first conductive material layer 1. In addition to the deposition/formation of the patterning layer 3, the first portion A (low surface energy part 3a), which has a critical surface tension that is different of that of other parts (high surface energy part 3b) of the patterning layer, is formed at a part where the first conductive material layer 1 and the second conductive material layer 7 are electrically connected.

The material used to form the patterning layer 3 and the wettability changing insulation layer 5 is a material having a low surface energy (low surface energy material). The surface energy of the low surface energy material changes to high surface energy when applied with energy (e.g. UV rays). Further, details of the low surface energy material are given further below.

The patterning layer 3 in this example is a self-organizing film which does not include an Si element but includes a hydrophobic group. Since a unimolecular film (monomolecular film) is spontaneously formed on the substrate 2 and the first conductive material layer 1, the self-organizing film can achieve fine high definition patterning. Furthermore, removal of such film can be performed easily by applying energy thereto.

In this example, "self-organizing film which does not include an Si element but includes a hydrophobic group" molecules of a surface active agent (e.g. aliphatic acid), an organic sulfur compound (e.g. alkanethiols in which —SH bonds to an end of a hydrocarbon chain or a fluoroalkyl group, and an organo phosphate compound) (e.g. alkyl phosphates). The typical commonality of the molecular structures is that the molecular structure includes a relatively long alkyl chain, an oxyethylene chain, or a fluorocarbon chain which has 5 or more carbon atoms and a functional group (e.g. a mercapto group, a carboxyl group, a phosphate group) which interacts with the substrate surface at one end of the molecular structure. Also, a composite type having the alkyl chain, the oxyethylene chain, and/or the fluorocarbon chain in a single molecule may be used. Also, a composite-type self-organizing film composed of plural kinds of the molecules may be used. Also, a polymer having a dendrimer structure applied on the substrate surface may also be used as the self-organizing film, wherein the dendrimer structure includes repeat branch units from the center of the structure.

A preferable and applicable alkanethiol is a compound expressed as the chemical formula shown below.

X—(CR$_2$)$_n$—(CZ$_2$)$_m$—Y—SH    [Chemical Formula 1]

In Chemical formula 1, "X" is, for example, CH$_3$—, CF$_3$—, CN—, a halogen group, a vinyl group, or a phenyl group. "R" and "Z" is, for example, H or F. "m" and "n" are, for example, integers satisfying a relation of 1<m+n<30. "Y" is, for example, —CH$_2$—, CF$_2$—, —CO—, or —NH—.

The solvent used for depositing/forming the patterning layer 3 and the wettability changing insulation layer 5 includes, for example, an organic solvent which can be mixed with water under a predetermined proportion. Accordingly, in a case of depositing the patterning layer 3 and/or the wettability changing insulation layer 5 on a material layer that is soluble with an organic solvent having low polarity, no damage is caused upon the material layer by the deposition of the patterning layer 3 and/or the wettability changing insulation layer 5. More specifically, the solvent includes, for example, alcohol solvents (e.g. ethanol, methanol, propanol), glycol solvents (e.g. ethylene glycol, propylene glycol, diethylene glycol), and cellosolve solvents (e.g. 2-methoxyethanol, 2-ethoxyethanol, 2-butoxyethanol).

In a case of coating (depositing) onto a material layer to which the patterning layer 3 and/or the wettability changing insulation layer 5 can be applied, the coating (applying) methods which can be used are, for example, a surface printing method (e.g. flexo printing), a stencil printing method (e.g. screen printing), a surface printing method (e.g. offset printing), or an intaglio printing method (e.g. gravure printing). As for other alternative coating (applying) methods, there are, for example, a spin-coating method, a blade coating, a dipping method, or a spray-coating method.

As for the energy to be applied for changing the critical surface tension, a UV (ultraviolet) ray is preferred. By using the UV ray, fine patterns can be easily formed. The UV ray is irradiated to the surface of the patterning layer 3 via an exposure mask 4. Thereby, a high surface energy part having a prescribed pattern can be obtained. It is preferable for the UV ray to have a relatively short wavelength ranging from 100 nm to 300 nm, for example. In FIG. 1B, a black-colored part of the exposure mask 4 is the part where the irradiated UV ray is blocked, and the white-colored part of the exposure mask 4 is the part (open part) where the irradiated UV ray is passed (transmitted) through. It is to be noted that the colored parts of the exposure mask 4 also apply to those of the exposure mask 6 shown in FIG. 1E and also the exposure masks described in the below-described third and fourth embodiments of the present invention).

It is to be noted that the energy to be used is not limited to UV rays. For example, heat, electron rays, or plasma may alternatively be used as the energy (although the advantages of using UV rays may be reduced to some degree).

By applying the UV ray to the patterning layer 3 and the wettability changing insulation layer 5, the low surface energy parts 3a, 5a and the high surface energy parts 3b, 5b are formed on the patterning layer 3 and the wettability changing insulation layer 5, respectively (See FIGS. 1C and 1F). It is-to be noted that the surface energy (i.e. critical surface tension) of the low surface energy parts 3a, 5a is low in terms that the high surface energy part 3b, 5b has a higher surface energy (i.e. critical surface tension) than that of the low surface energy parts 3a, 5a. It is preferable that the difference between the critical surface tension of the low surface energy parts 3a, 5a and the critical surface tension of the high surface energy parts 3b, 5b to be 10 mN/m or more. This is described with reference to FIGS. 2-4 and Table 1 (shown below).

FIG. 2 is schematic view for describing the state shown in FIGS. 1C and 1F. In FIG. 2, the low surface energy part 3a and the high surface energy part 3b of the patterning layer 3 are indicated with parentheses, and the low surface energy part 5a and the high surface energy part 5b of the wettability changing insulation layer 5 are indicated without parentheses.

First, the low surface energy part 3a and the high surface energy part 3b of the patterning layer 3 are described with reference to FIG. 2. In this example, the patterning layer 3 is formed on the substrate 2 and the first conductive material layer 1 (not shown in FIG. 2, See FIGS. 1B and 1C) to serve as a base for having the wettability changing insulation layer 5 deposited/formed thereon. The patterning layer 3 is formed of a material having a critical surface tension that can be changed by being applied with energy. The patterning layer 3 according to this embodiment of the present invention includes at least two parts (portions), in which each part has a different critical surface tension. The part having a higher critical surface tension is the high surface energy part 3b, and the part having a lower critical surface tension is the low surface energy part 3a. In FIG. 2, the space between the two high surface energy parts 3b is set as a fine gap being approximately 1 μm to 5 μm. Then, the wettability changing insulation layer 5 is formed on the high surface energy parts 3b.

As the material to be used as the patterning layer 3, it is preferable to use a material that exhibits a significant change of critical surface tension before and after energy (e.g. UV rays, heat, electron rays, plasma) is applied thereto. By irradiating energy to a prescribed portion(s) of the patterning layer 3, patterns of different critical surface tension (i.e. high surface energy part 3b and low surface energy part 3a) are formed on the patterning layer 3. Accordingly, a liquid containing wettability changing insulation material can easily adhere to the high surface energy part 3b (having a lyophilic property) and not to the low surface energy part 3a (having a lyophobic or water repellent property). This enables the liquid containing the wettability changing insulation material to selectively adhere to the high surface energy part 3b in accordance with the shape (configuration) of the pattern. That is, as shown in FIG. 1D, the wettability changing insulation layer 5 is deposited/formed by having the liquid adhere to the high surface energy part 3b (portion of the patterning layer 3 other than the first part A) and solidifying the part to which the liquid adheres.

Next, the low surface energy part 5a and the high surface energy part 5b of the wettability changing insulation layer 5 are described with reference to FIG. 2. In this example, the wettability changing insulation layer 5 is deposited/formed on the patterning layer 3 formed on the substrate 2 and the first conductive material layer 1 (not shown in FIG. 2, see FIGS. 1B and 1C). The wettability changing insulation layer 5 is formed of a material having a critical surface tension that can be changed by being applied with energy. The wettability changing insulation layer 5 according to this embodiment of the present invention includes at least two parts (portions), in which each part has a different critical surface tension. The part having a higher critical surface tension is the high surface energy part 5b, and the part having a lower critical surface tension is the low surface energy part 5a. In FIG. 2, the space between the two high surface energy parts 5b is set as a fine gap being approximately 1 μm to 5 μm. Then, the second conductive material layer 7 is formed on the high surface energy parts 5b.

Same as the patterning layer 3, the material to be used as the wettability changing insulation layer 5 is preferably a material that exhibits a significant change of critical surface tension before and after energy (e.g. UV rays, heat, electron rays, plasma) is applied thereto. By irradiating energy to a prescribed portion(s) of the wettability changing insulation layer 5, patterns of different critical surface tension (i.e. high surface energy part 5b and low surface energy part 5a) are formed on the wettability changing insulation layer 5. Accordingly, a liquid containing conductive material can easily adhere to the high surface energy part 5b (having a lyophilic property) and not to the low surface energy part 5a (having a lyophobic or water repellent property). This enables the liquid containing conductive material to selectively adhere to the high surface energy part 5b in accordance with the shape (configuration) of the pattern. That is, as shown in FIG. 1G, the second conductive material layer 7 is formed by having the liquid adhere to the high surface energy part 5b (second portion B of the wettability changing insulation layer 5) and solidifying the high surface energy part 5b.

Figure 3:
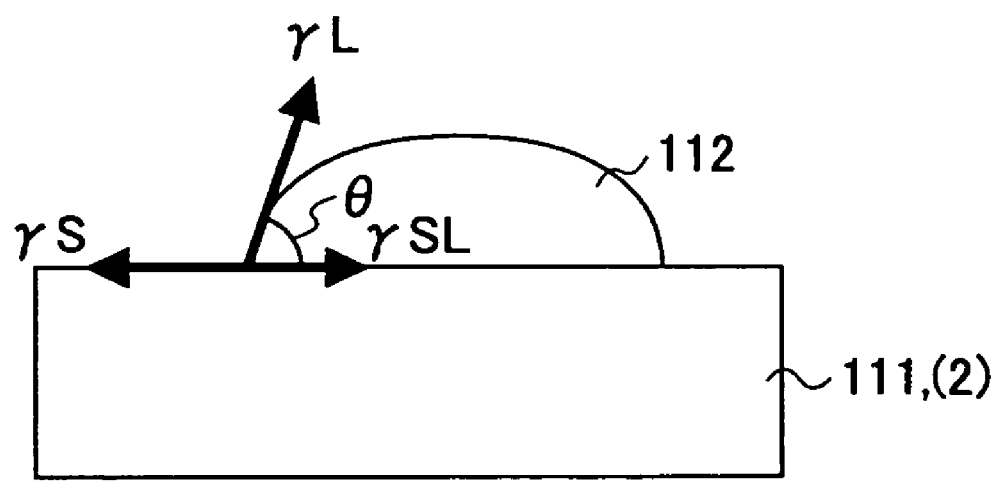
FIG. 3 is a schematic drawing for describing wettability of a liquid on a solid surface.

Next, the wettability (adherence) of a liquid with respect to a surface of a solid (solid surface) is described. FIG. 3 is a schematic drawing showing a liquid droplet 112 provided on a surface of a solid 111. In FIG. 3, the liquid droplet 112, being in an equilibrium state, has a contact angle of θ and satisfies Young's equation shown below.

$$\gamma S = \gamma SL + \gamma L \cos \theta \quad \text{[Equation 1]}$$

In Equation 1, "γS" indicates the surface tension of the solid 111, "γSL" indicates the interfacial tension between the solid 111 and the liquid (liquid droplet 112), and "γL" indicates the surface tension of the liquid (liquid droplet 112).

Surface tension is substantially the same meaning as surface energy, and the value of surface tension is substantially equal to the value of surface energy. In a case where cos θ=1, a relation of θ=0° (0 degrees) is satisfied. This relation indicates a substantially completely wetted state by the liquid (liquid droplet 112). The value of γL in this state is "γS-γSL" and is referred to as the critical surface tension of the solid 111 (indicated as "γ C"). The γ C is can be easily determined by plotting the relation between the surface tension and the contact angle of the liquid (liquid droplet 112) with use of various liquids having predetermined surface tensions and obtaining a surface tension that satisfies the relation of θ=0° (cos θ=1) (Zisman Plot). The liquid (liquid droplet 112) has high wettability (lyophilic property) in a case where the solid 111 has a large γ C, and has low wettability (lyophobic property) in a case where the solid 111 has a small γ C.

The contact angle θ can be easily measured by using the various sessile drop methods described below. (a) In one method (tangential line method), the contact angle is measured by focusing a microscope to the droplet 112 and matching a cursor line in the microscope with a tangent point (contact point) of the droplet 112. (b) In another method (θ/2 method), the contact angle is measured by matching a cross-shaped cursor to the apex of the droplet 112 and doubling the angle of the cursor line when one end thereof is matched with a contact point between the droplet 112 and the solid 111 specimen. (c) In yet another method (3 point clicking method), the contact angle is measured by visualizing the droplet 112 on a monitor screen, clicking (designating) one point situated on the circumference (preferably the apex) of the droplet 112 and the two contact points between the droplet 112 and the solid 111 specimen, and processing the data of the three points with a computer.

The precision in measuring the contact angle becomes higher in the order of methods (a), (b) and (c).

Figure 4:
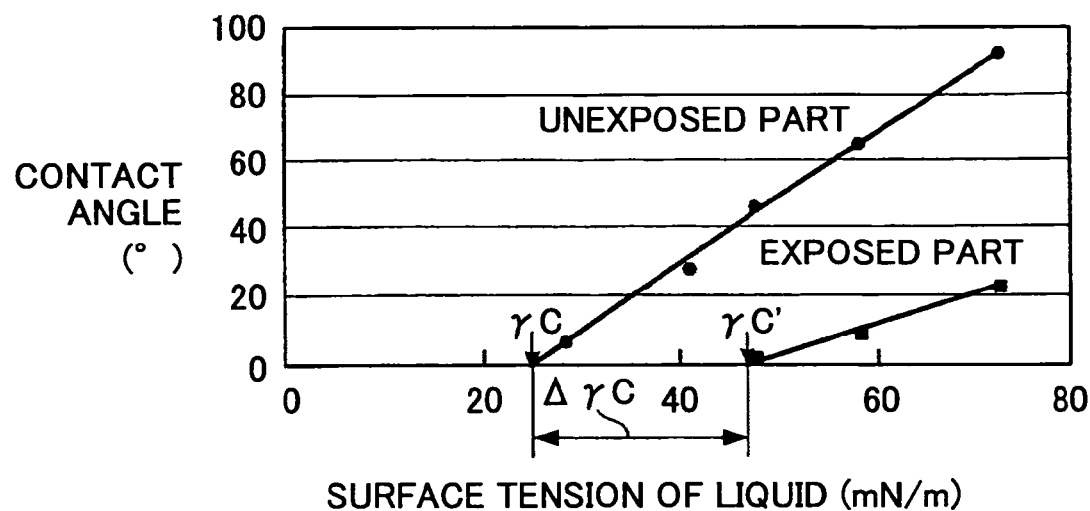
FIG. 4 is a graph showing the property of surface tension and contact angle in a case of performing the Zisman plot according to an embodiment of the present invention.

The graph in FIG. 4 shows the results of performing the Zisman plot on a part exposed to UV irradiation (UV exposed part) and a part unexposed to UV irradiation (UV unexposed part) in a case where a side-chain polyimide (described below in Experiment 1) is used as the material of the patterning layer 3 and the wettability changing insulation layer 5. FIG. 4 shows that the critical surface tension of the UV unexposed part (γ C) being approximately 24 mN/m, the critical surface tension of the UV exposed part (γ C') being approximately 45 mN/m, and the difference thereof $\Delta \gamma C$ being approximately 21 mN/m.

Accordingly, it is desired for the difference of surface energy (i.e. the difference of critical surface tension $\Delta \gamma C$) to be relatively large in order for the liquid containing the wettability changing insulation material to satisfactorily adhere only to the high surface energy parts 3b, 5b in accordance to the patterns of the high and low surface energy parts 3a, 5a, 3b, and 5b.

Table 1 (shown below) shows the results of evaluating the $\Delta \gamma C$ of energy exposed parts and energy unexposed parts and the selective adherence of polyaniline (aqueous conductive polymer) in a case of using various materials to form the patterning layer 3 and the wettability changing insulation layer 5 on a glass substrate. The selective adherence is evaluated by applying a droplet of polyaniline solution to an area including the pattern interface of the energy exposed part and the energy unexposed part and determining whether there is polyaniline solution still adhered to the energy unexposed part (i.e. pattern failure) after excess solution is removed from the solution applied. In Table 1, "A" indicates a polyvinyl phenol (Product Name: MARUKA LYNCUR, Manufactured by: Maruzen Petrochemical Co.), "B" indicates a polyimide (Product Name: RN-1024, Manufactured by Nissan Chemical Co.), "C" indicates a fluorine containing acrylate polymer (Product Name: AG-7000, Manufactured by: Asahi Glass Co.), and "D" indicates a polyimide mixture indicated by the below-given Chemical Formulas 1 and 2 subsequent to burning.

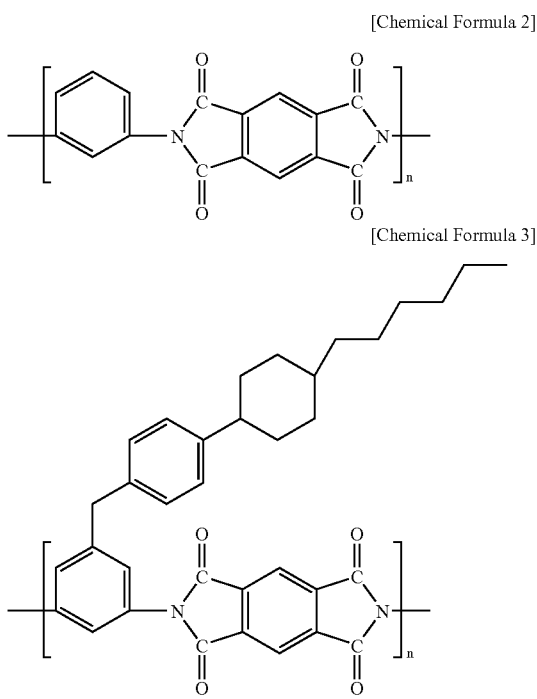

[Chemical Formula 2]

[Chemical Formula 3]

TABLE 1

| Material | Energy | $\Delta \gamma C$ | Pattern Results |
|---|---|---|---|
| A | UV | 6 mN/m | X |
| B | UV | 10 mN/m | ○ |
| C | Heat | 15 mN/m | ◎ |
| D | UV | 21 mN/m | ◎ |

In Table 1, "x" indicates that a large amount of solution is remaining on the unexposed part, "○" indicates that a small amount of solution is remaining on the unexposed part, and "◎" indicates that no solution is remaining on the unexposed part. Accordingly, the results in Table 1 show that satisfactory patterns can be formed when the difference of the critical surface tension between the high surface energy parts 3b, 5b and the low surface energy parts 3a, 5a of the patterning layer 3 and the wettability changing insulation layer 5 ($\Delta \gamma C$) is 10 mN/m or more, and even more satisfactory results can be obtained when the $\Delta \gamma C$ is 15 mN/m or more.

Accordingly, a liquid containing conductive material (i.e. wettability changing insulation material of the wettability changing insulation layer 5 and the conductive material of the second conductive material layer 7) can be positively applied (adhered) to a target surface by setting the difference of critical surface tension between the energy applied parts ($\Delta \gamma C$) to a significantly large value (preferably by setting the $\Delta \gamma C$ to 10 mN/m or more, and more preferably by setting the $\Delta \gamma C$ to 15 mN/m or more).

Next, the functions and properties of the wettability changing insulation layer 5 are described.

As described above, the solvent used for depositing/forming the wettability changing insulation layer 5 includes an organic solvent which can be mixed with water under a predetermined proportion. The proportion of the organic solvent with respect to the entire solvent used for depositing/forming the wettability changing insulation layer 5 is preferably 30 vol % or more. It is more preferable when the proportion of the organic solvent with respect to the entire solvent used for depositing/forming the wettability changing insulation layer 5 is 90% or more.

The wettability changing insulation layer 5 may be formed of a single material or two or more kinds of materials. By using two or more kinds of materials to form the wettability changing insulation layer 5, properties other than changing wettability can also be attained for the wettability changing insulation layer 5.

Figure 5:
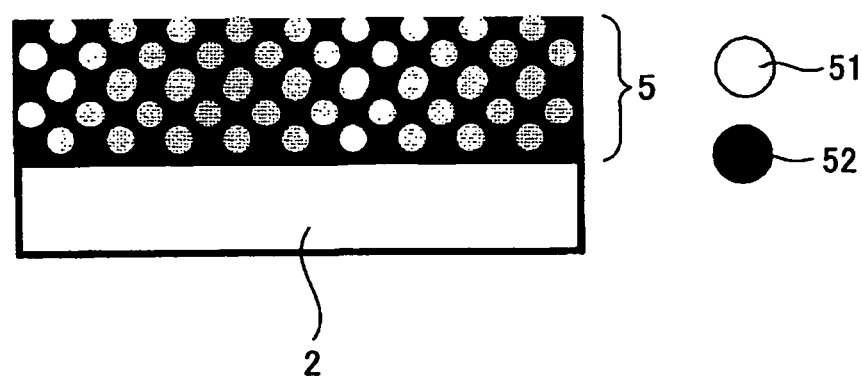
FIG. 5 is a schematic drawing for describing a wettability changing insulation layer having a mixture of first and second materials according to an embodiment of the present invention.

This allows a wider variety of materials to be employed for the wettability changing insulation layer 5, for example, a material having a relatively large wettability changing property but poor deposition property. More specifically, as in the example shown in FIG. 5, a first material 51, which is capable of exhibiting a relatively large wettability changing performance but is difficult to deposit due to its strong cohesion property, may be mixed with a second material 52 having satisfactory deposition property, to thereby form the wettability changing insulation layer 5.

In another example where the wettability changing insulation layer 5 includes at least the first material 51 and the second material 52, the first material 51 included in the wettability changing insulation layer 5 may have a function which exhibits a greater change of critical surface tension (when applied with energy) compared to the change of critical surface tension of the second material 52, and the second material 52 may have a different function. The first and second materials 51 and 52 may be distributed in various manners inside the wettability changing insulation layer 5 in the film thickness direction as shown in FIGS. 6A-6E. Although the second material 52 is illustrated darker than the first material 51, the difference of darkness merely serves to indicate the distribution of the two materials and does not indicate the density (concentration) of the respective materials. In this example, it is more preferable for the first material 51 of the uppermost layer to have a density of approximately 100%. This allows the wettability changing function of the first material 51 (having a greater wettability changing function than that of the second material 52) to positively perform its wettability changing function. The wettabilty changing insulation layer 5 shown in FIG. 5 may be fabricated by forming the layer including the first material 51 and then forming the layer including the second material 52 on the layer including the first material 51. As for the method of fabricating the wettability changing insulation layer 5, a vacuum process (vacuum deposition) or a coating process using a solvent may be employed.

Figure 6A:
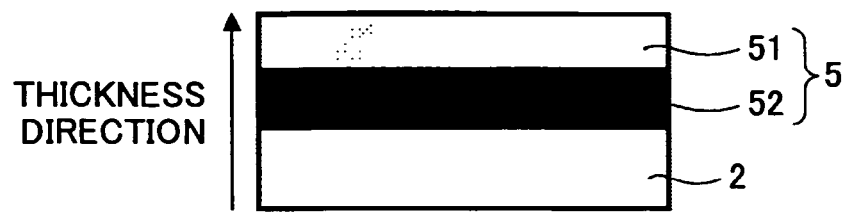
FIGS. 6A-6E are schematic drawings for describing the distribution and the density of a mixture of first and second materials in a wettability changing insulation layer according to an embodiment of the present invention.
Figure 6B:
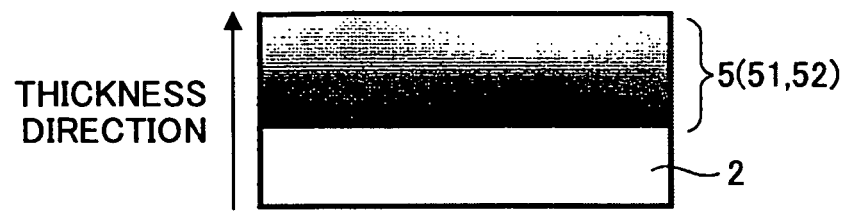
Figure 6C:
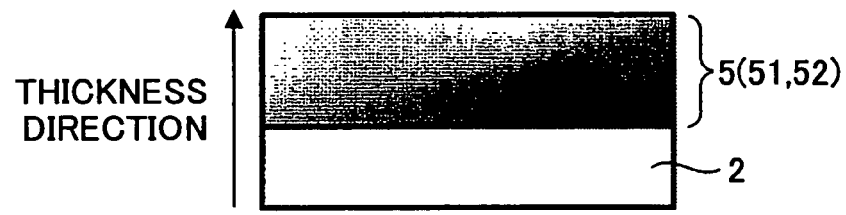
Figure 6D:
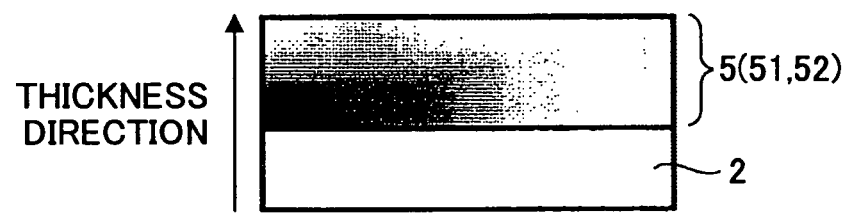
Figure 6E:
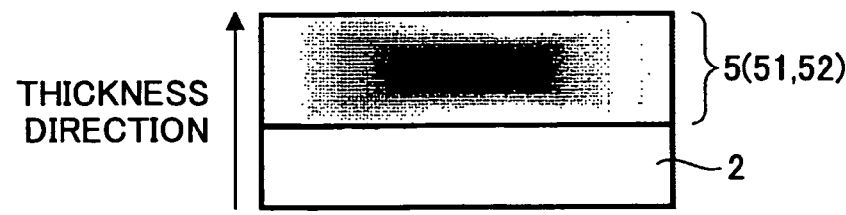

As for the method of fabricating the layer configuration shown in FIG. 6B, the layer configuration can be fabricated by applying a mixed solution of the first material 51 and the second material 52 on the substrate 2 and drying the substrate on which the mixed solution (wettability changing insulation layer 5) is applied. In a case where the first material 51 has less polarity than that of the second material 52 or in a case where the first material 51 has fewer molecules than those of the second material 52, the first material 51 migrates toward the upper surface of the layer configuration in the drying process of the layer configuration until the mixed solution evaporates, to thereby form the wettability changing insulation layer 5.

Although the interface between the first material 51 and the second material 52 included in the wettability changing insulation layer 5 may not be definitely separated in the manner illustrated in FIG. 6A, the mixed solution containing the first and second materials 51, 52 can be applied if the first material 51 of the uppermost portion of the wettability changing insulation layer 5 has a density which is higher than that of the second material 52. In the variations shown in FIGS. 6C-6E, the first material 51 and the second material 52 mixed inside in the wettability changing insulation layer 5 may have a predetermined concentration distribution.

In a case where the wettability changing insulation layer 5 includes three or more materials, the wettability changing insulation layer 5 may have a layered configuration comprising three or more layers, or a single layer having the three or more materials mixed with a predetermined concentration distribution in the thickness direction.

In addition to providing the second material 52 with less wettability (critical surface tension) changing property than the first material 51 for achieving reliable adhesion, the second material 52 may be provided with more satisfactory insulation property than the first material 51 for achieving satisfactory insulation performance and enabling fine patterns to be formed to the conductive material layer 7.

In such a case, the proportion of the first material 51 having greater wettability changing property and the second material 52 having more satisfactory insulation property (second material 52/first material 51) ranges from approximately 50/50 to 99/1 by weight. As the proportion of the first material 51 increases, the insulating performance of the wettability changing insulation layer 5 decreases, such that the wettability changing insulation layer 5 becomes unsuitable for an insulation layer of an electronic device. On the other hand, in a case where the proportion of the second material 52 is increased, the conductive material layer 7 cannot be satisfactorily patterned since the wettability changing property is reduced. Accordingly, the satisfactory proportion between the first material 51 and the second material 52 ranges from 60/40 to 95/5 (second material 52/first material 51). A more satisfactory proportion between the first material 51 and the second material 52 ranges from 70/30 to 90/10 (second material 52/first material 51). Furthermore, it is preferable for the wettability changing insulation layer 5 to have a volume resistivity of approximately $1 \times 10^{12}$ Ω·cm or more.

In another example, in addition to providing the second material 52 with less wettability (critical surface tension) changing property than the first material 51 for achieving reliable adhesion, the second material 52 may be provided with lower dielectric constant than the first material 51 for providing the wettability changing insulation layer 5 with a prescribed dielectric constant.

Figure 13A:
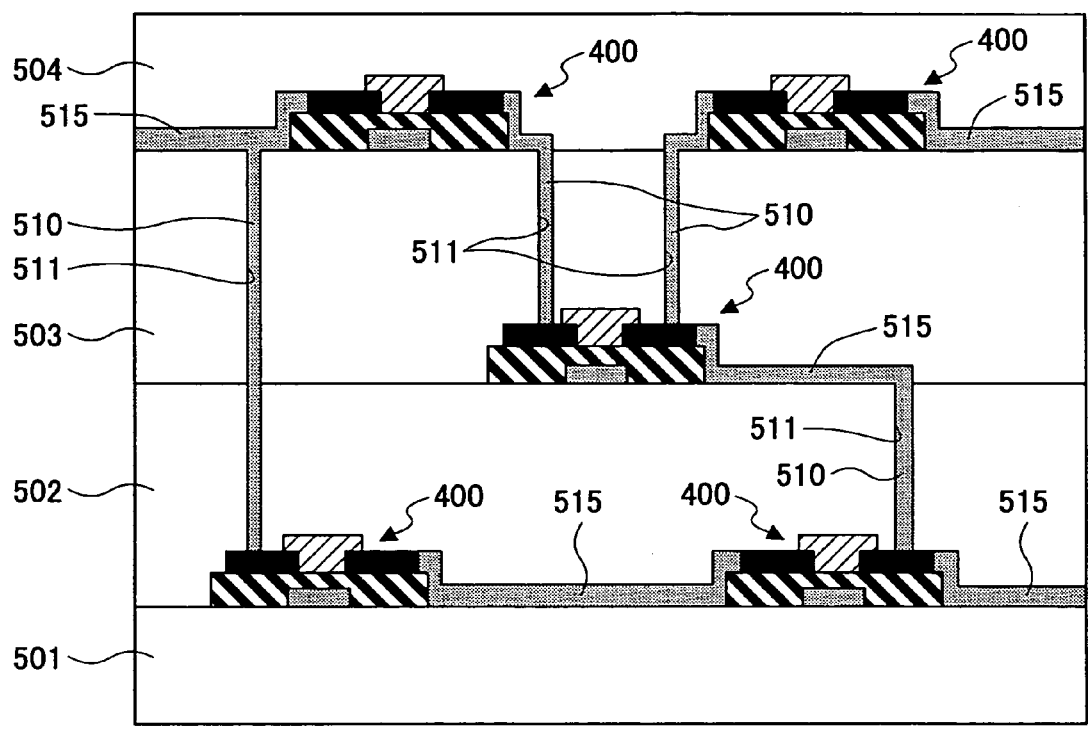
FIGS. 13A-13B are schematic drawings showing an electrodes and contact holes included in an electronic device and a semiconductor arithmetic circuit.
Figure 13B:
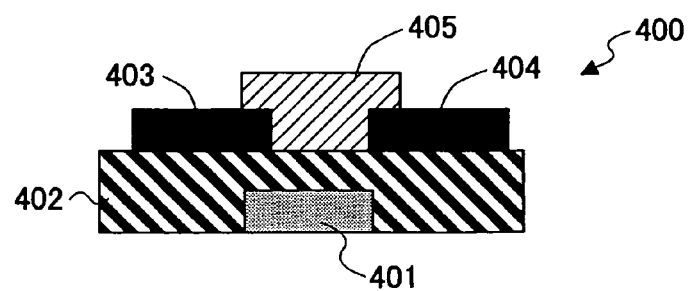
Figure 14:
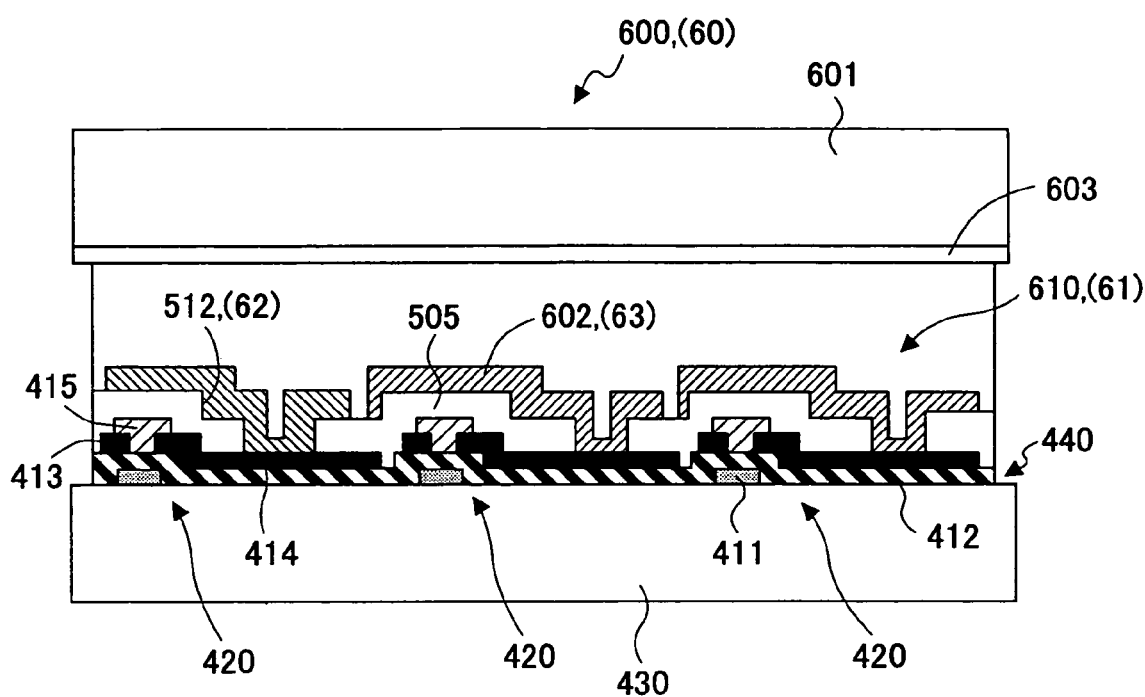
FIG. 14 is a schematic drawing showing a display device.
Figure 15A:
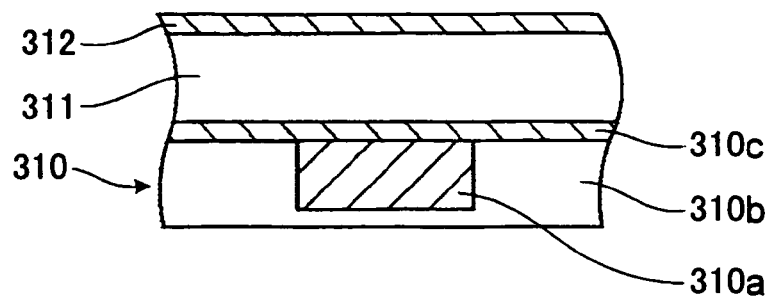
FIGS. 15A-15C are schematic drawings for describing a process of manufacturing a semiconductor device according to a related art.
Figure 15B:
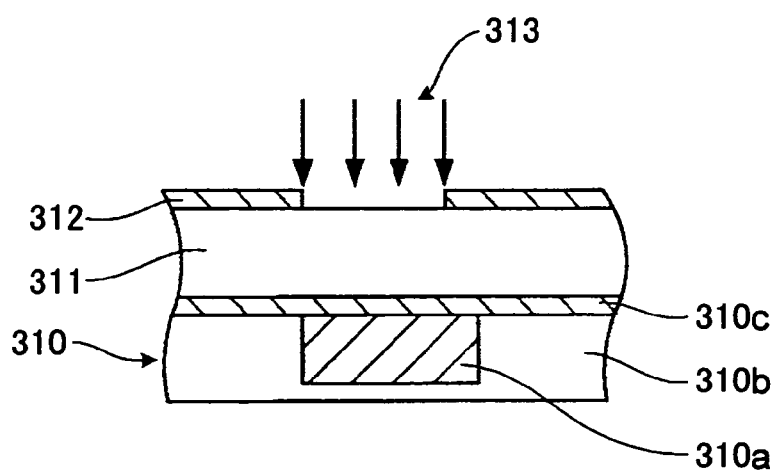
Figure 15C:
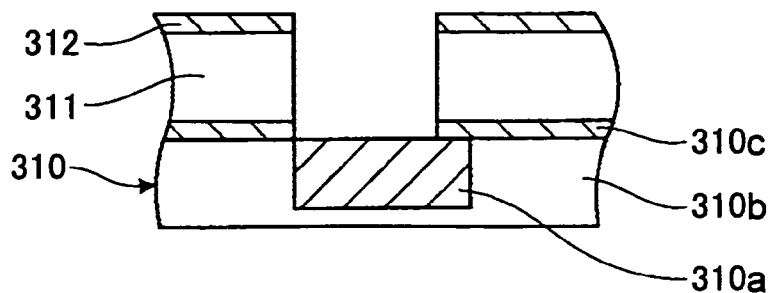
Figure 17:
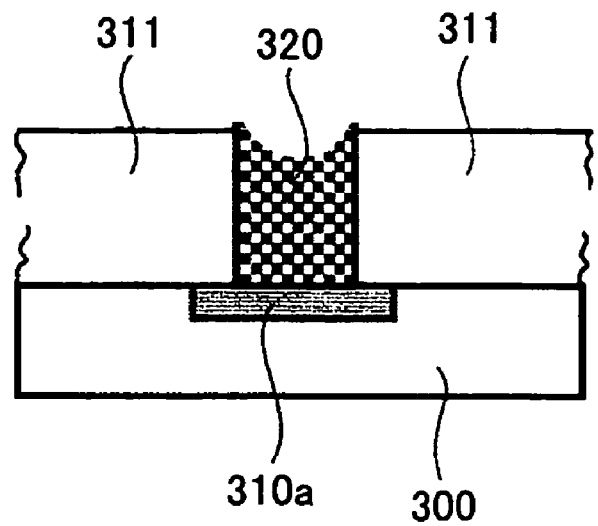
FIG. 17 is a schematic drawing showing a state where an upper electrode is polished.
Figure 18:
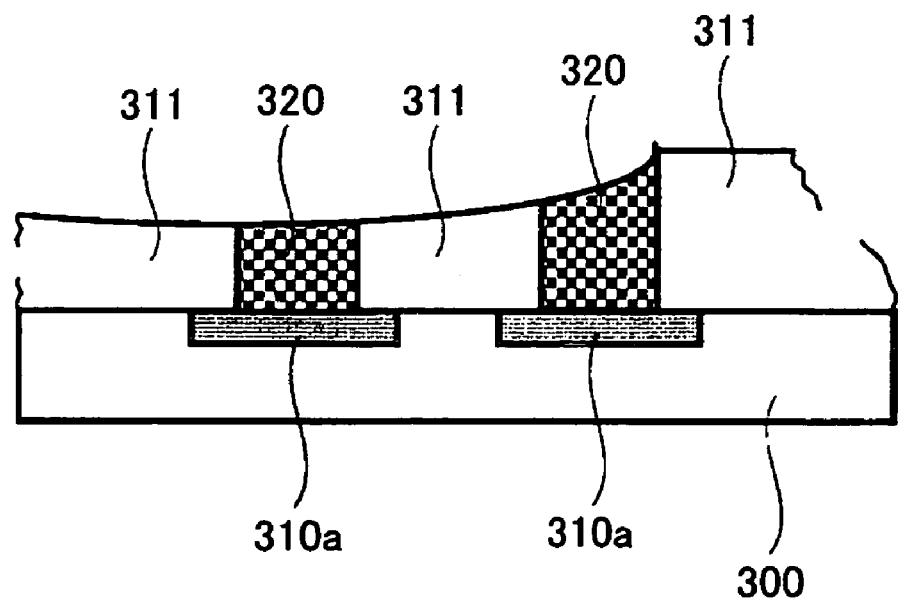
FIG. 18 is a schematic drawing showing a state where an upper electrode is polished.

Accordingly, in a case of forming multiple interlayer insulation films 500-505 (as shown in FIGS. 13A and 14, for example), parasitic capacitance, which causes wiring delay, can be reduced. Since wiring delay leads to reduction of operational frequency of a semiconductor arithmetic element (e.g. LSI), the prevention of wiring delay enables the manufacture of semiconductor arithmetic elements having high operational frequency. In this example, a low dielectric constant refers to a dielectric constant of $SiO_2$ used for a typical insulation film:=less than 3.9.

Furthermore, it is preferable to include a polymer material having a side-chain that includes a hydrophobic group in the material of the wettability changing insulation layer 5. Accordingly, since the difference between a hydrophilic part and a water repellant part becomes larger as energy is applied to the wettability changing insulation layer 5, fine electrode patterns can be formed on the wettability changing insulation layer 5.

More specifically, as shown in FIG. 7, the polymer material may be, for example, a material having a main chain structure (e.g. polyimide, (metha)acrylate) having its main chain L bonded (directly or via a bonding group) to a side chain R including a hydrophobic group.

The hydrophobic group includes, for example, a group in which its end structure is expressed as —$CF_2CH_3$, —$CF_2CF_3$, —$CF(CF_3)_2$, —$CF_2H$, or —$CFH_2$. A group having a long carbon chain is preferable for making the orientating among molecule chains easier. It is more preferable for the group to have 4 or more carbon atoms. Furthermore, it is preferable to employ a polyfluoroalkyl group having two or more of its alkyl group hydrogen atoms replaced by fluorine atoms (hereinafter indicated as "Rf group"). It is more preferable for the Rf group to have 4 to 20 carbon atoms (more preferably 6 to 12 carbon atoms). Although it is preferable for the Rf group to have a straight chain structure, the Rf group may also have a branch structure. Furthermore, a preferable hydrophobic group is a perfluoroalkyl group having substantially all of its alkyl group hydrogen atoms replaced by fluorine atoms. It is preferable for the perfluoroalkyl group to be expressed as "$C_nF_{2n+1}$—", wherein n is an integer ranging from 4 to 16 (it is more preferable for n to range from 6 to 12). Although it is preferable for the perfluoroalkyl group to have a straight chain structure, the perfluoroalkyl group may also have a branch structure.

The above-described polymer materials have a characteristic in that they become lyophilic when contacting a liquid or solid in a heated state and become lyophobic when heated in air. In other words, the critical surface tension of the above-described polymer materials can be changed in accordance with the selected contact medium and the thermal energy applied thereto.

Furthermore, the hydrophobic group may also include a group in which its end structure includes no fluorine atoms, such as —$CH_2CH_3$, —$CH(CH_3)_2$, or —$C(CH_3)_3$. It is also preferable for the group to have a long carbon chain for making the orientating among molecule chains easier. It is more preferable for the group to have 4 or more carbon atoms. Although it is preferable for this group to have a straight chain structure, the group may also have a branch structure. Such alkyl group may include halogen atoms, a cyano group, a phenyl group, a hydroxyl group, a carboxyl group. The alkyl group may also include an alkyl group having a straight chain structure, a branch structure, or an annular structure having 1 to 12 carbon atoms, or a phenyl group replaced by an alkoxy group. The surface energy becomes lower (less critical surface tension) and the property of the wettability changing insulation layer 5 becomes more lyphobic as the number of side chains R (see FIG. 7) increases. Furthermore, since the applying of energy breaks the bond or changes the orientation, the critical surface tension of the wettability changing insulation layer 5 increases and the property of the wettability changing insulation layer 5 becomes lyphilic.

The polymer having a side-chain including a hydrophobic group is preferably a polymer containing polyimide. Polyimide has advantageous properties such as an insulating property, a chemical resistant property, and a heat resistant property. Therefore, in a case of performing various processes (e.g. forming electrodes thereon) on the wettability changing insulation layer 5, the wettability changing insulation layer 5 can be prevented from swelling and cracking caused by solvents or temperature change during a burning process, for example. Accordingly, since the wettability changing insulation layer 5 can be prevented from being damaged in a manufacture process, the wettability changing insulation layer 5 can provide sufficient insulation. The polyimide material is deposited by applying a polyamic acid (as shown below in Chemical Formula 4) on a target substrate and then heating the substrate on which the polyamic acid is applied. Accordingly, a polyimide coating (as shown below in Chemical Formula 5) is obtained. Since the polyamic acid below is a chemical compound having high polarity, the solvent used for forming the wettability changing insulation layer 5 is an organic solvent that is soluble with water under a predetermined proportion and is applicable to a material layer that dissolves in an organic solvent having low polarity.

In a case where the wettability changing insulation layer 5 includes two or more materials, the other material besides the polymer having a side-chain including a hydrophobic group is preferred to include polyimide when considering the aspects of heat resistance, chemical resistance and affinity.

It is also preferable to use polyimide as interlayer material owing that polyimide has a dielectric constant is lower than that of $SiO_2$ (which is a typical material used as an insulation material).

Examples for the polymer having a side-chain including a hydrophobic group according to an embodiment of the present invention are shown below in Chemical Formulas 6-10.

In Chemical Formula 8, "Z" is, for example, $CH_2$, CFH, $CF_2$, $CH_2CH_2$, or $CF_2O$; "Y" is, for example, 1,4-cyclohexylene or 1,4-phenylene having 1 to 4 H atoms replaced by F or $CH_3$; "$A^1$"-"$A^3$" each are, for example, independently single bond 1,4-cyclohexylene or 1,4-phenylene having 1 to 4 H atoms replaced by F or $CH_3$; "$B^1$"-"$B^3$" each are, for example, independently single bond alkylene having 1 to 4 carbon atoms, oxyalkylene having 1 to 3 carbon or oxygen atoms, alkyleneoxy having 1 to 3 carbon atoms; "R" is, for example, alkyl having 1 to 10 carbon atoms and having H or $CH_2$ replaced by $CF_2$, alkoxy or alkoxyalkyl having 1 to 9 carbon atoms having one $CH_2$ replaced by $CF_2$. The bond position of the amino group is discretional with respect to the benzene ring. It is to be noted, however, that "$B^1$" to "$B^3$" cannot all be alkylene having 1 to 4 carbon atoms at the same time in a case where "Z" is $CH_2$. Furthermore, "$A^1$" and "$A^2$" cannot both be single bond at the same time in a case where "Z" is $CH_2CH_2$. and "Y" is 1,4-phenylene. Furthermore, "Y" cannot be 1,4-cyclohexylene in a case where "Z" is $CF_2O$.

[Chemical Formula 6]

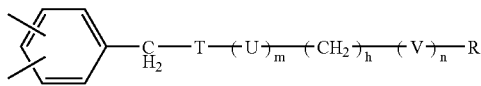

In Chemical Formula 6, "X" is, for example, —$CH_2$— or —$CH_2CH_2$—; "$A^1$" is, for example, 1,4-cyclohexylene, 1,4-phenylene, or 1,4-phenylene replaced by 1 to 4 fluorine atoms; "$A^2$", "$A^3$" and "$A^4$" each are, for example, single bond, 1,4-cyclohexylene, 1,4-phenylene, or 1,4-phenylene replaced by 1 to 4 fluorine atoms; "$B^1$", "$B^2$", and "$B^3$" each are, for example, independently single bond or —$CH_2CH_2$—; "$B^4$" is, for example, alkylene having 1 to 10 carbon atoms; "$R_3$", "$R_4$", "$R_5$", "$R_6$", and "$R_7$" each are, for example, independently alkyl having 1 to 10 carbon atoms; and "p" is an integer which is no less than 1.

[Chemical Formula 9]

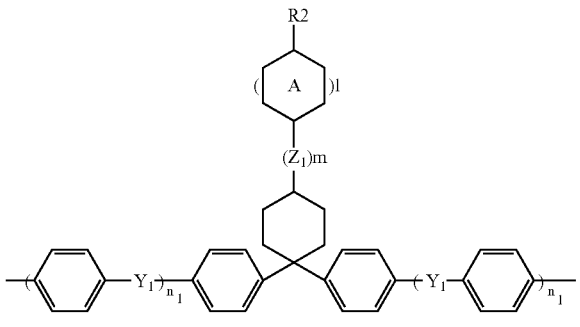

In Chemical Formula 9, "R2" is, for example, an alkyl group having 1 to 12 carbon or hydrogen atoms; "$Z_1$" is, for example, a $CH_2$ group; "m" ranges, for example, from 0 to 2; "A" is, for example, a benzene ring or a cyclohexane ring; "l" is, for example, 0 or 1; "$Y_1$" is, for example, independently an oxygen atom or a $CH_2$ group; and "$n_1$" is, for example, 0 or 1.

[Chemical Formula 7]

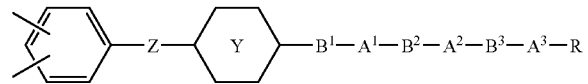

In Chemical Formula 7, "T", "U", and "V" are, for example, a benzene ring or a cyclohexane ring, respectively; "H" on these rings may be, for example, replaced by alkyl having 1 to 3 carbon atoms, a fluorine replaced alkyl having 1 to 3 carbon atoms, F, Cl, or CN; "m" and "n" each are, for example, independently an integer which ranges from 0 to 2; "h" is, for example, an integer which ranges from 0 to 5; "R" is, for example, H F, Cl, CN or a univalent organic group; the two "U"s may be the same or different in a case where "m" is 2; and the two "V"s may be the same or different in a case where "n" is 2.

[Chemical Formula 10]

In Chemical Formula 10, "$Y_2$" is independently an oxygen atom or a $CH_2$ group; "R3" and "R4" are independently an alkyl group having 1 to 12 hydrogen or carbon atoms or a perfluoroalkyl group having 1 to 12 hydrogen or carbon atoms (at least one of "R3" and "R4" is an alkyl group having 3 or more carbon atoms or a perfluoroalkyl group having 3 or more carbon atoms); and "$n_2$" is independently 0 or 1.

More details regarding the materials of the above-described hydrophobic group are described in Japanese Laid-Open Patent Application Nos. 2002-162630, 2003-96034, and 2003-267982.

The tetracarboxylic dianhydride included in the main chain structures of the above-described hydrophobic group may include various materials such as aliphatic series, alicyclic series, aromatic series (More specifically, pyromellitic acid dianhydride, cyclobutane tetracarboxylic dianhydride, and butane tetracarboxylic dianhydride, for example). The mate-

[Chemical Formula 8]

rials disclosed in Japanese Laid-Open Patent Application No. 11-193345, 11-193346, and 11-193347 may also be used in the material of the above-described hydrophobic group.

As described above, the polyimide including the hydrophobic group shown in Chemical Formulas 6-10 may be a single material or a mixture (combination) of materials. It is preferable to include polyimide in the mixture considering the aspects of heat resistance, chemical resistance, and affinity. Furthermore, a polyimide material including a hydrophobic group other than those shown in Chemical Formulas 6-10 may also be used.

The thickness of the wettability changing insulation layer 5 according to an embodiment of the present invention is preferably 30 nm to 3 µm (more preferably, 50 nm to 1 µm) In a case where the thickness of the wettability changing insulation layer 5 is less than the preferred thickness, properties for serving as a bulk body (e.g. insulation property, gas barrier property, moisture barrier property) will be poorer. In a case where the thickness of the wettability changing insulation layer 5 is greater than the preferred thickness, it will be difficult to form a desired form (pattern) on the surface thereof.

Next, the process of applying energy to the wettability changing insulation layer 5*a* for forming the low surface energy part 5*a* and the high surface energy part 5*b* is described in further detail (Process shown in FIG. 1E).

As shown in FIG. 8A, a UV ray is irradiated to the surface of the wetting changing insulation layer 5 using the exposure mask 6 as a mask. Thereby, a pattern (wettability pattern) comprising the low surface energy part 5*a* and the high surface energy part 5*b* is formed as shown in FIG. 8B. The UV ray is preferred to have a relatively short wavelength ranging, for example, from 100 nm to 300 nm. In FIGS. 8A and 8B, reference numeral 9 indicates an electrode which is one example of the first conductive material layer 1. In this example, the energy for changing the critical surface tension of the wettability changing insulation layer 5 is applied by performing UV irradiation. This allows fine patterns to be easily formed on the wettability changing insulation layer 5.

Next, the process of applying a liquid including a conductive material for forming the second conductive material layer 7 that covers the second portion B is described in further detail (Processes shown in FIGS. 1F and 1G). Same as the method for depositing the first conductive material layer 1, the method for applying the liquid including the second conductive material includes various printing method, such as a surface printing method, a relief printing method, an intaglio printing method, and a stencil printing method. Both the first and second conductive material layers 1, 7 are preferred to be formed by applying heat or irradiating UV rays to the conductive material thereof. The liquid including the conductive material used for depositing the first conductive material layer 1 may also be used for depositing the second conductive material layer 7. The liquid including the conductive material may be, for example, 1) a liquid including a solvent having a conductive material dissolved therein, 2) a liquid including a precursor of a conductive material or a solvent having the precursor dissolved therein, 3) a liquid including a solvent having conductive particles dispersed therein, or 4) a liquid including a solvent having a precursor of a conductive material dispersed therein. More specifically, the liquid including the conductive material may be, for example, a liquid including an organic solvent or water having fine metal particles (e.g. Ag, Au, Ni) dispersed therein, or a liquid including an aqueous solution having PANI (polyaniline) doped therein or having PSS (polystyrene sulfonic acid) doped to PEDOT (polyethylenedioxythiophene).

As described above, the method for coating (depositing) the conductive material layers (including the first and second conductive material layers 1, 7) may be, for example, a surface printing method (e.g. flexo printing), a stencil printing method (e.g. screen printing), a surface printing method (e.g. offset printing), or an intaglio printing method (e.g. gravure printing). As for other alternative coating (depositing) methods, there is, for example, a spin-coating method, a blade coating method, a dipping method, or a spray-coating method. Accordingly, the cost of the above-described methods for coating (depositing) the conductive material layers is inexpensive compared to vacuum depositing methods such as a vapor deposition method. Furthermore, in a case where one of a spin-coating method, a dipping method, a blade coating method, or a spray coating method is used as the method for applying the liquid including the conductive material onto the surface on which a wettability pattern is formed, the time for fabricating the electronic device can be reduced. In addition, manufacture cost can also be reduced since such a case requires no printing apparatus. In another method, a conductive layer can be formed only on the high surface energy part 5*b* by using an inkjet method, for example.

The distance L between electrodes is becoming smaller as electrode wirings are formed in finer sizes (See FIG. 9A). In some cases, there is a possibility of short-circuit between electrodes during the process of applying the conductive material with a conventional method (See FIG. 9C). However, in applying the conductive material according to the first embodiment of the present invention, short-circuit of electrodes can be prevented owing that the conductive material can be applied only to the high surface energy part 5*b* and thus maintain a sufficient distance L1 between the electrodes by using an inkjet method, for example. Accordingly, with the present invention, fine electrodes and electronic devices can be reliably fabricated.

In FIG. 1G, the first and second conductive material layers 1 and 7 have the patterning layer 3 remaining therebetween at the second portion B. However, in a case where the low surface energy part 3*a* of the patterning layer 3 has undesired resistance, that is, in a case where the patterning layer 3 is not a self-organizing film (a unimolecular film), the low surface energy part 3*a* of the patterning layer 3 may be etched (without changing the surface energy property of the wettability changing insulation layer 5 at the second portion B) before the process of depositing (forming) the second conductive material layer (second electrode layer ) 7. For example, in a case where the wettability changing insulation layer 5 has sufficient chemical resistance with respect to a prescribed solvent while the patterning layer 3, on the other hand, does not have sufficient resistance with respect to the prescribed solvent, the prescribed solvent may be used for etching the low surface energy part 3*a* of the patterning layer 3.

In a case where the patterning layer 3 is a self-organizing film (a unimolecular film), the patterning layer 3 provides substantially no insulation property since the patterning layer 3 has an extremely small thickness. Therefore, the low surface energy part 3*a* of the patterning layer 3 provides sufficient electric continuity and has no undesired resistance.

Subsequent to the process of fabricating the second conductive material layer 7 (as shown in FIG. 1G), a process of applying voltage between the first and second conductive material layers 1 and 7 may be performed. This process can reduce the resistance between the first conductive material layer 1 and the second conductive material layer 7. For example, in a case where there is residue of the patterning layer 3 or removable patterning layer 8 (described below with reference to FIG. 11B) which could not be thoroughly removed, such residual layers may sometimes create undesired resistance between the first and second conductive material layers 1, 7 and may adversely affect the performance of the electronic device. However, the residual layers can be eliminated by applying the voltage between the first and second conductive material layers 1, 7. The voltage to be applied is preferred to be high voltage to the extent that the electronic device is not damaged.

With the first embodiment of the present invention, an electronic device can be manufactured with a fewer number of steps compared to a conventional method. Furthermore, an electronic device, which has a fine configuration including a contact hole and a pair of electrodes with an insulation film interposed therebetween, can be easily manufactured.

SECOND EMBODIMENT

Next, the second embodiment of the present invention is described with reference to FIGS. 10, 14 and 19.

Figure 10:
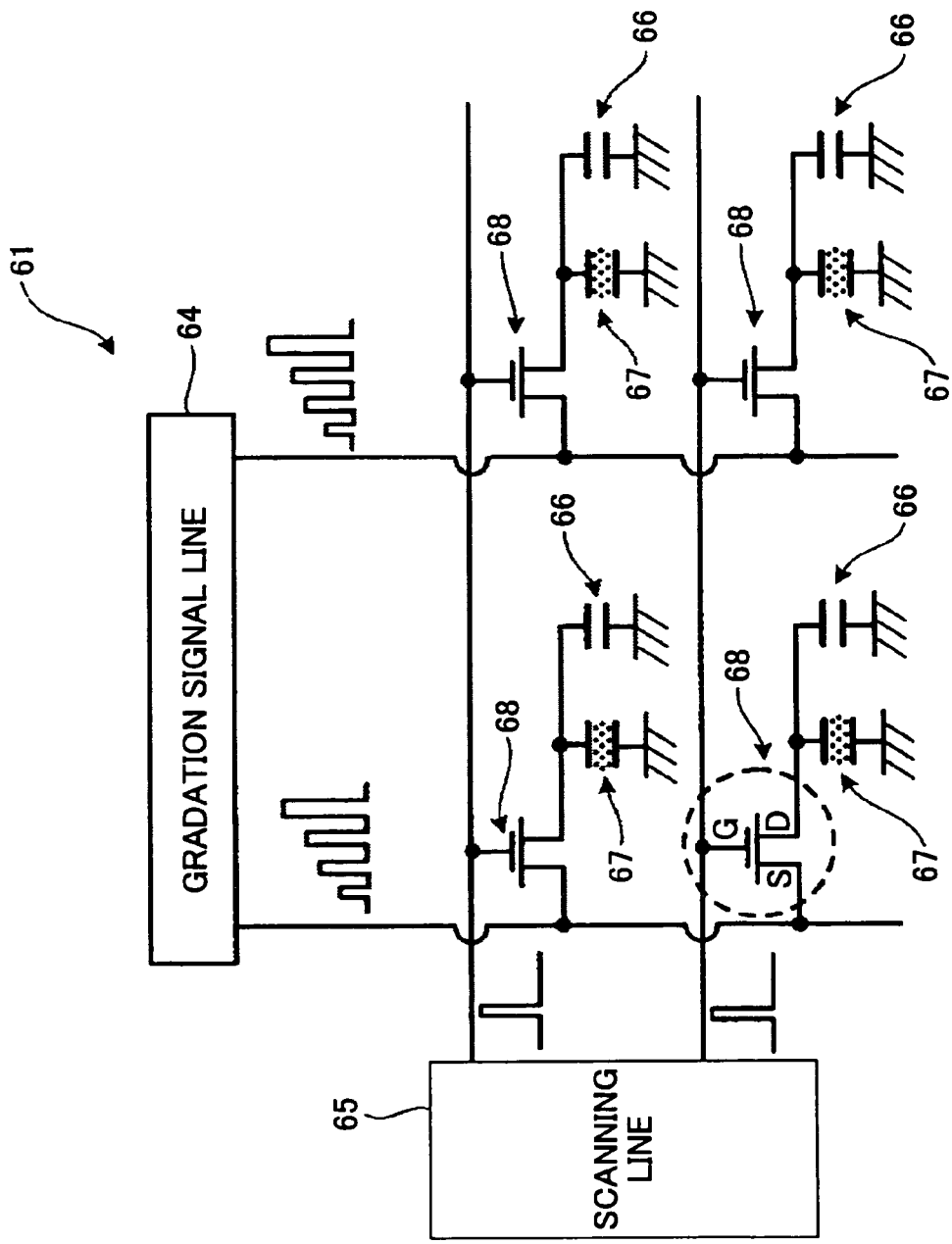
FIG. 10 is a wiring diagram of a display element (liquid crystal display element) included in a display device according to an embodiment of the present invention.
Figure 12:
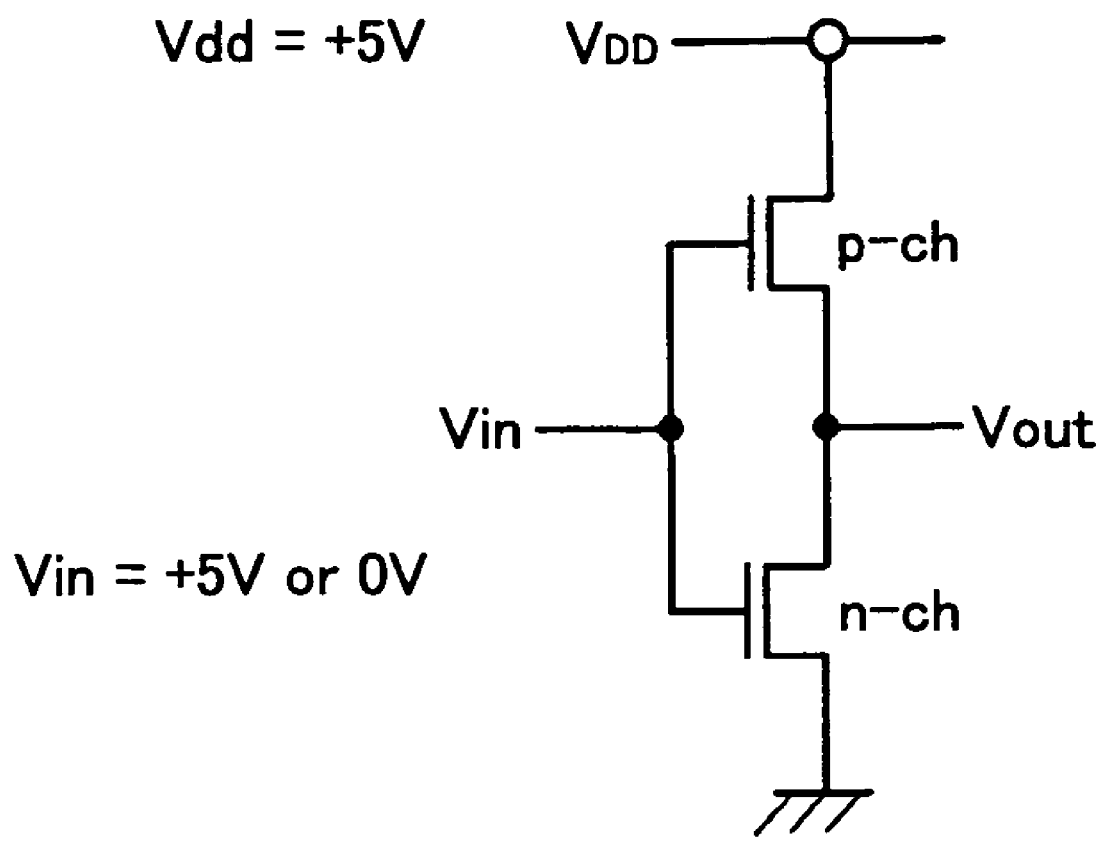
FIG. 12 is a circuit diagram of a transistor for describing a related art.

FIG. 10 is a wiring diagram of a liquid crystal display element 61. The liquid crystal display element 61 is an example of a display element including an electronic device (including as contact hole 62 and pixel electrode 63 as shown in FIG. 14) obtained by performing the contact hole/electronic device manufacturing method according to the first embodiment of the present invention. FIG. 14 shows a configuration of a display part of a display device 60 including the liquid crystal display element 61 shown in FIG. 14.

Figure 19:
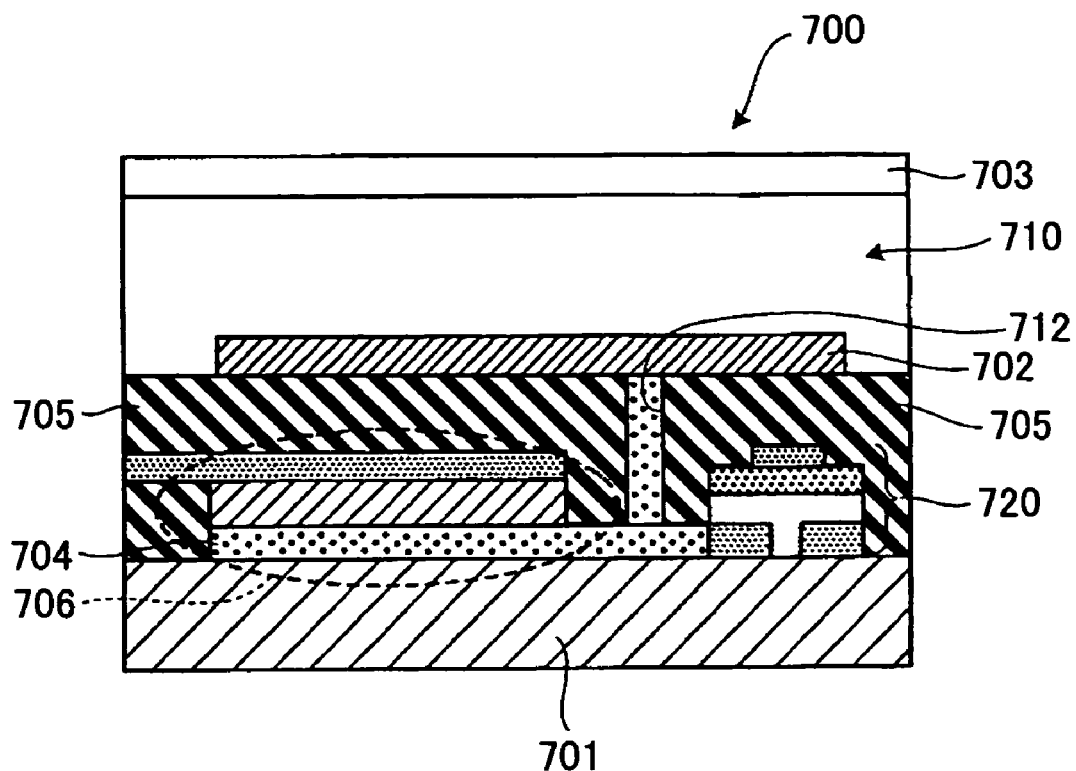
FIG. 19 is a schematic drawing showing a display device according to an embodiment of the present invention.

FIG. 19 is a cross-sectional view of a configuration of another display device 700 including a display element 710. The display element 710 is another example of a display element including an electronic device (including as contact hole 712 and pixel electrode 702 as shown in FIG. 19) obtained by performing the contact hole/electronic device manufacturing method according to the first embodiment of the present invention.

In FIG. 10, the gradation signal line 64 applies a prescribed voltage to each liquid crystal cell 67 via an active element 68 (For example, TFT) according to the gradation of each pixel. More specifically, in a scanning operation, the gradation signal line 64 sequentially applies ON/OFF signal voltage line by line (pixel line) via each active element 68. After a scanning operation for one screen is completed, a scanning operation for the next screen is started. In a case of displaying moving images, the preferred interval is 50 Hz or more (no more than 1/50 sec). In FIG. 10, each condenser 66 includes a function of charging the voltage of the gradation signals during a period of transferring from a scanning operation for one screen to a scanning operation for another screen. In the active element 68 shown in FIG. 10, the letter "S" indicates a source electrode (first electrode), the letter "D" indicates a drain electrode (second electrode), and the letter "G" indicates a gate electrode (third electrode).

FIG. 14 shows an electronic device array 440 including the above-described electronic device, in which a display element 610 is provided between a substrate 430 and a second substrate 601 including a transparent conductive film 603. The display element 610, which is provided on a drain electrode (which also serves as a pixel electrode), is switched on and off by the electronic element 420 (TFT). The material used for the second substrate 601 may be, for example, glass or plastic (e.g. polyester, polycarbonate, polyarilate, polyether sulfone). The display element 610 may be, for example, a liquid crystal display type, an electrophoresis type, or an organic EL type.

Therefore, in a reflection type liquid crystal element including a layer of the electronic element 610 disposed on the electronic element array 440 as shown in FIG. 14, the interlayer insulation film 505 is disposed on the electronic element array 440, and the pixel electrode 63 disposed on the interlayer insulation film 505 is connected to the drain electrode 414 of the electronic device 420 via the contact hole 62.

Accordingly, the above-described display device and the display element can be manufactured with fewer numbers of steps, to thereby provide an inexpensive display device and an inexpensive display element.

The method for manufacturing an electronic device and the electronic device manufactured by using the method according to the first embodiment of the present invention can be applied to wiring electrodes and contact holes for connecting transistors (semiconductor elements) and diodes. The transistors (semiconductor elements) and diodes including the electronic device according to the first embodiment of the present invention may be used in, for example, LSI, VLSI, ULSI, a microcomputer, a host computer, a work station, or a personal computer. Accordingly, as described above, an inexpensive semiconductor arithmetic element can be obtained owing to the reduced number of steps for manufacturing the semiconductor arithmetic element. In this case, a material having a low dielectric constant is preferred to be used as the material of the interlayer insulation film so that operational frequency can be improved.

EXAMPLE 1

Next, a first example of an electronic device according to an embodiment of the present invention is described with reference to the process shown in FIGS. 1A to 1G.

In FIG. 1A, a Cr/Au film is formed on the substrate 2 (in this example, a glass substrate) by depositing a Cr/Au electrode (i.e. first conductive material layer 1) of a prescribed pattern by using a metal exposure mask (not shown). The thickness of the Cr/Au film (electrode) in this example is approximately 100 nm. Then, a mixed solvent having a precursor (which has a structure expressed with the below-given Chemical Formula 11 and the above-described Chemical Formula 2 subsequent to a burning process) dissolved therein is applied on to the substrate 2 and the first conductive material layer 1 by using a spin-coating method. Then, the mixed solvent is burned in a temperature of 180° C. As a result, a patterning layer 3 having a thickness of 50 nm is obtained.

[Chemical Formula 11]

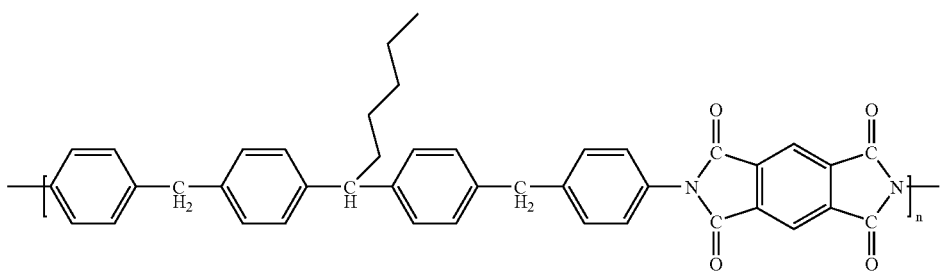

Then, as shown in FIG. 1B, a UV ray is irradiated to the patterning layer 3 by a UV lamp. In this example, the wavelength of the UV ray is 250 nm. Furthermore, the distance between the light source of the UV ray and the substrate 2 (on which the patterning layer 3 is provided) is adjusted so that the irradiation strength is 9 mW/cm$^2$. As a result, the low surface energy part 3a (first portion A) is formed on the patterning layer 3.

Next, the another mixed solvent having a precursor (which has a structure expressed with the below-given Chemical Formula 12 and the above-described Chemical Formula 2 subsequent to a burning process) dissolved therein is applied on to the patterning layer 3 by using an inkjet method. Then, the mixed solvent is burned in a temperature of 280° C. As a result, a wettability changing insulation layer 5 having a thickness of 200 nm is obtained, as shown in FIG. 1D.

[Chemical Formula 12]

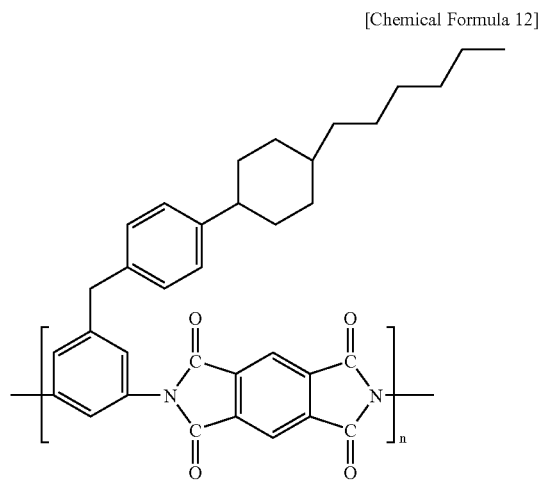

Then, as shown in FIG. 1E, a UV ray is irradiated to the wettability changing insulation layer 5 by a UV lamp. In this example, the wavelength of the UV ray is 250 nm. Furthermore, the distance between the light source of the UV ray and the substrate 2 (on which the patterning layer 3 and the wettability changing insulation layer 5 are provided) is adjusted so that the irradiation strength is 9 mW/cm$^2$. As a result, the high surface energy part 5b (second portion B) is formed on the wettability changing insulation layer 5, as shown in FIG. 1F. Then, an aqueous solution of PEDOT/PPS (conductive polymer) is applied to the high surface energy part 5b (second portion B) of the wettability changing insulation layer 5 by using an inkjet method. As a result, the second conductive material layer 7 is formed (deposited) on the high surface energy part 5b (second portion B) of the wettability changing insulation layer 5, as shown in FIG. 1G.

Then, the amount of resistance between the first and second conductive material layers 1 and 7 was evaluated in a case where a direct current of 10 V is applied between the first and second conductive material layers 1 and 7. The resistance obtained in this case was 12 KΩ.

EXAMPLE 2

In a second example of an electronic device according to an embodiment of the present invention, the manufacture conditions and processes are the same as those of the first example. In the second example, however, the amount of resistance between the first and second conductive material layers 1 and 7 was evaluated where the direct current applied between the first and second conductive material layers 1 and 7 is 1000 V. A relative value of resistance of the second example was evaluated in a case where the resistance value of the first example is the criterion value 1.0.

EXAMPLE 3

In a third example of an electronic device according to an embodiment of the present invention, the manufacture conditions and processes are the same as those of the first example. In the third example, however, the material used for the patterning layer 3 is a chemical compound material expressed as the below-given Chemical Formula 13 and is dissolved in an ethanol solution. The substrate 2, having the first conductive material layer 1 formed thereon, is dipped in the ethanol solution. Under these conditions, the resistance of the third example was evaluated in the same manner as the first example.

$CH_3—(CH_2)_7—SH$  [Chemical Formula 13]

EXAMPLE 4

Next, a fourth example of an electronic device according to an embodiment of the present invention is described with reference to the process shown in FIGS. 21A to 21H.

Figure 21A:
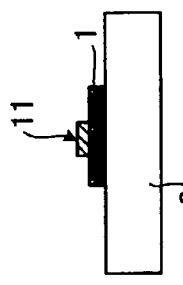
FIGS. 21A-21H are schematic drawings for describing a process for manufacturing an electronic device and for forming a contact hole according to an embodiment of the present invention.

In FIG. 21A, a Cr/Au film is formed on the substrate 2 (in this example, a glass substrate) by depositing a Cr/Au electrode (i.e. first conductive material layer 1) of a prescribed pattern by using a metal exposure mask (not shown). The thickness of the Cr/Au film (electrode) in this example is approximately 100 nm. Then, the substrate 2 having the first conductive material layer 1 formed thereon is dipped in the above-described ethanol solution that includes the chemical compound expressed with Formula 13. As a result, a patterning layer 10 (in this example, the patterning layer 10 is a formed of an insulation material) is formed (deposited) on the first conductive material layer 1 and the substrate 2.

Figure 21B:
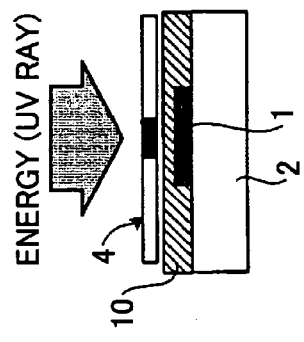
Figure 21C:
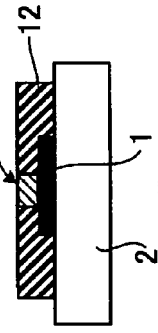
Figure 21D:
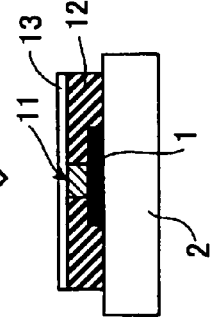

Then, as shown in FIG. 21B, a UV ray is irradiated to the patterning layer 10 by a UV lamp. In this example, the wavelength of the UV ray is 250 nm. Furthermore, the distance between the light source of the UV ray and the substrate 2 (on which the patterning layer 10 is provided) is adjusted so that the irradiation strength is 3 mW/cm$^2$. As a result, a water repellent part 11 is formed on the patterning layer 10, as shown in FIG. 21C. Then, a mixed solvent having a precursor (which has a structure expressed with the above-described Chemical Formula 2) dissolved therein is applied on to the substrate 2 and the first conductive material layer 1 by using an inkjet method. Then, the mixed solvent is burned in a temperature of 210° C. As a result, an insulation material layer 12 having a thickness of 200 nm is obtained as shown in FIG. 21D.

Figure 21E:
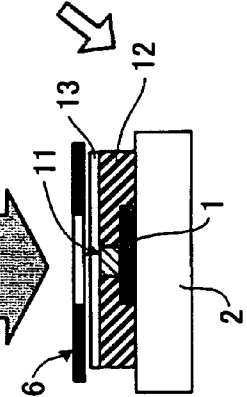

Then, the substrate 2 having the insulation material layer 12 formed thereon is dipped in the above-described ethanol solution expressed with the Chemical Formula 13. As a result, a low surface energy layer 13 is formed (deposited) on the water repellent part 11 and the insulation material layer 12 as shown in FIG. 21E.

Figure 21F:
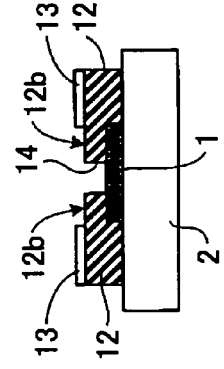
Figure 21G:
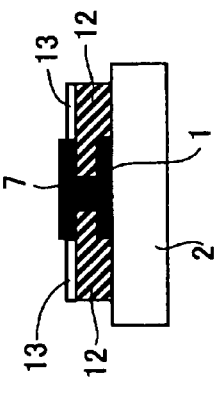

Then, as shown in FIG. 21F, a UV ray is irradiated to the low surface energy layer 13 by a UV lamp. In this example, the wavelength of the UV ray is 250 nm. Furthermore, the distance between the light source of the UV ray and the substrate 2 (on which the insulation material layer 12 and the low surface energy layer 13 is provided) is adjusted so that the irradiation strength is 9 mW/cm$^2$. This irradiation improves the critical surface tension of UV exposed parts. In this example, the difference between the surface energy of the exposed part and the unexposed part is approximately 12 mN/m. As a result, the water repellent part 11 and a part of the low surface energy layer 13 is removed, as indicated with reference numerals 12b and 14 in FIG. 21G.

Figure 21H:
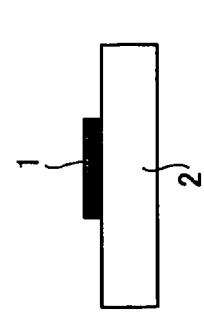

Then, an aqueous solution of PEDOT/PPS (conductive polymer) is applied to the area of the removed water repellent part 11 and the removed part of the low surface energy layer 13 by using an inkjet method. As a result, the second conductive material layer 7 is deposited (formed) on the first conductive layer 1 and the insulation material layer 12, as shown in FIG. 21H. Then, in the same manner as Example 1, the amount of resistance between the first and second conductive material layers 1 and 7 was evaluated in a case where a direct current of 10 V is applied between the first and second conductive material layers 1 and 7.

COMPARATIVE EXAMPLE 1

Except for changing the material of the wettability changing insulation layer 5 of Example 1 to another wettability changing insulation material expressed with the above-described Chemical Formula 3, the manufacture conditions and processes are the same as the Example 1.

COMPARATIVE EXAMPLE 2

Except for changing the material of the wettability changing insulation layer 5 of Example 1 to another wettability changing insulation material expressed with the above-described Chemical Formula 2, the manufacture conditions and processes are the same as the Example 1.

The evaluation results of Examples 1-4 and Comparative Examples 1-2 are shown below in Table 2.

TABLE 2

|  | Example 1 | Example 2 | Example 3 | Example 4 | Comparative Example 1 | Comparative Example 2 |
| --- | --- | --- | --- | --- | --- | --- |
| Resistance | 1.0 | 0.01 | * | * | — | — |
| Others | — | — | — | — | ** | *** |

In Table 2, "*" indicates that the resistance value is considerably low and that resistance could not be measured; "" indicates that the wettability changing insulation layer. 5 could not be deposited; and "*" indicates that the second conductive material layer 7 (second electrode) could not be patterned.

According to the evaluation results shown in Table 2, Examples 1-3 exhibited results within a range suitable for practical use. The most satisfactory results are exhibited by Examples 3 and 4, in which the resistance could not be measured given that the resistance values are considerably low. The next preferred result is exhibited by Example 2, and is further followed by the result of Example 1. The comparative examples exhibited results exceeding the range suitable for practical use.

THIRD EMBODIMENT

Next, another method of manufacturing an electronic device and a configuration of an electronic device manufactured by the method according to the third embodiment of the present invention are described with reference to FIGS. 11A-11G.

First, a first conductive material layer 1 is formed by depositing/forming a first conductive material on a substrate 2 (See FIG. 11A). Then, a removable patterning layer 8, which is removable and is formed of a material having a critical surface tension different from that of the first conductive material, is selectively deposited/formed on the first conductive material layer 1 and the substrate 2 (See FIG. 11B). Then, by applying energy (e.g. UV ray) to the removable patterning layer 8, a first portion A' of the removable patterning layer 8 (i.e. low surface energy part 8a), which has a critical surface tension that is different from that of other portions of the removable patterning layer 8, is formed at the part where the first conductive material layer 1 electrically contacts a second conductive material layer 7 (described below) (See FIG. 11C). Then, a wettability changing insulation layer 5, which is a material layer having a function of changing its critical surface tension when applied by energy (e.g. UV rays) and a function of insulating, is formed/deposited on the substrate 2 and the first conductive material layer 1 except for the part on which the first portion A' of the removable patterning layer 8 is provided (See FIG. 11D). Then, by applying energy (e.g. UV rays) to a portion of the wettability changing insulation layer 5 (See FIG. 11E), a second portion B' (i.e. high surface energy part 5b), which has a critical surface tension that is different from that of other portions of the wettability changing insulation layer 5 (i.e. low surface energy part 5a), is formed in communication with the first portion A' (See FIG. 11F). Then, the second conductive material layer 7, which is formed of a second conductive material, is formed at least on the second portion B' (See FIG. 11G). Thereby, the first conductive material layer 1 and the second conductive material layer 7 are electrically connected only at the first portion A' in a state where the wettability changing insulation layer 5 (including the low surface energy portion 5a and the high surface energy portion 5b) serving as an insulation material layer is disposed therebetween. Furthermore, it may be said that the above-described method of manufacturing an electronic device according to the third embodiment of the present invention (as shown in FIGS. 11A-11G) is also a method of forming a contact hole, in which the contact hole formed by the method enables the first conductive material layer 1 and the second conductive material layer 7 to electrically connect only at the first portion A' in a state having the wettability changing insulation layer 5 disposed therebetween.

Accordingly, as shown in FIGS. 11A-11G, the electronic device manufactured by the above-described method according to the third embodiment of the present invention includes the first conductive material layer 1, the removable patterning layer 8 (although in this example, the removable patterning layer 8 is already substantially mostly removed and not illustrated in FIGS. 11C-11G) having the low surface energy part 8a (first portion A') and the high surface energy part provided on the first conductive layer 1, the wettability changing insulation layer 5 having the low surface energy part 5a and the high surface energy part 5b provided on the removable patterning layer 8, and the second conductive material layer 7 provided on the wettability changing insulation layer 5 (at least on the second portion B'). In the electronic device according to the third embodiment of the present invention, the first conductive material layer 1 and the second conductive material layer 7 are electrically connected only at the first portion A' in a state where the wettability changing insulation layer 5 serving as the insulation material layer is disposed therebetween.

The method of manufacturing an electronic device and a configuration of an electronic device manufactured by the method according to the third embodiment of the present invention is substantially the same as the those of the first embodiment of the present invention. One difference between the first and third embodiments of the present invention is that the removable patterning layer 8 is formed (deposited) in the third embodiment of the present invention.

Next, the method of manufacturing an electronic device, the configuration of an electronic device manufactured by the manufacturing method, and the method of forming the contact hole according to the third embodiment of the present invention are described in more detail (Mainly on the different aspects with respect to the first embodiment of the present invention).

The removable patterning layer 8 is formed of a material having a low surface energy. As shown in FIG. 11C, the removable patterning layer 8 is selectively removed by applying energy thereto. Thereby, the low surface energy part 8$a$ (i.e. first part A') is formed on the first conductive material layer 1. Since the surface energy of the surface of the first conductive material layer 1 and the substrate 2 is higher than the surface energy of the first part A', the wettability changing insulation layer 5 is formed (deposited) on the substrate 2 and the first conductive material layer 1 except for the part on which the low surface energy part 8$a$ (first part A') is provided.

If the wettability changing insulation layer 5 is desired to be partially formed (depositing) on the surface of the substrate 2 (rather than on the entire surface of the substrate 2) as shown in FIG. 11D, the wettability changing insulation layer 5 can be formed in such a manner by controlling (adjusting) the wettability of the surface of the substrate 2.

Similar to the patterning layer 3 in the first embodiment of the present invention, the removable patterning layer 8 may be formed a self-organizing film. Since a unimolecular film (monomolecular film) is spontaneously formed on the substrate 2 and the first conductive material layer 1, the self-organizing film can achieve fine high definition patterning. Furthermore, removal of such film can be performed easily by applying energy thereto. Examples of the compounds included in the self-organizing film are the same as those described in the first embodiment of the present invention.

Same as the patterning layer 3 and the wettablility changing insulation layer 5 in the first embodiment of the present invention, the solvent used for the removable patterning layer 8 includes an organic solvent which can be mixed with water under a predetermined proportion. Therefore, in a case of depositing the removable patterning layer 8 onto a layer formed of a material which dissolves in an organic solvent having low polarity, the deposition of the removable patterning layer 8 will not damage the layer.

In a case where a coatable material is used for the removable patterning layer 8 and/or the wettability changing insulation layer 5, the coatable material may be coated (deposited) by, for example, a surface printing method (e.g. flexo printing), a stencil printing method (e.g. screen printing), a surface printing method (e.g. offset printing), or an intaglio printing method (e.g. gravure printing). As for other alternative coating (depositing) methods, there are, for example, a spin-coating method, a blade coating, a dipping method, or a spray-coating method.

Same as the first embodiment of the present invention, UV irradiation is preferred as the method of applying energy to the removable patterning layer 8 and the wettablility changing insulation layer 5 for changing the critical surface tension thereof. The wavelength and the amount of irradiation of the UV ray is the same as those described in the first embodiment of the present invention.

As shown in FIGS. 11B and 11C, the application of UV ray to the removable patterning layer 8 causes the high surface energy part (part of the removable patterning layer 8 other than the low surface energy part 8$a$ of the removable patterning layer 8, not shown) to be selectively removed. That is, a predetermined part of the removable patterning layer 8 is removed so that a particular part of the removable patterning layer 8 (i.e. low surface energy part 8$a$, first part A') is left to remain. Same as the first embodiment of the present invention, it is preferred that the difference of critical surface tension between the low surface energy part 8$a$ and the high surface energy part of the removable patterning layer 8 is 10 mN/m or more. This can be understood by referring to FIGS. 2-4. In FIGS. 2-4, the parts illustrating the patterning layer 3 and the wettability changing insulation layer 5 correspond to the removable patterning layer 8, the parts illustrating the low surface energy part 3$a$, 5$a$ correspond to the low surface energy part 8$a$, and the parts illustrating the high surface energy part 3$b$, 5$b$ correspond to the high surface energy part of the removable patterning layer 8.

Same as the patterning layer 3 of the first embodiment of the present invention, the material preferred to be used as the removable patterning layer 8 is a material that exhibits a significant change of critical surface tension before and after energy (e.g. UV rays, heat, electron rays, plasma) is applied thereto. By applying energy to a prescribed portion(s) of the removable patterning layer 8, the high surface energy part of the removable patterning layer 8 is removed, to thereby form a predetermined pattern of different critical surface tension (i.e. the part where the high surface energy part is removed and the part of the low surface energy part 8$a$) on the removable patterning layer 8. Accordingly, a liquid containing wettability changing insulation material 5 can easily adhere to the part where the high surface energy part is removed (part having a lyophilic property) and not to the low surface energy part 8$a$ (part having a lyophobic or water repellent property). This enables the liquid containing the wettability changing insulation material to selectively adhere to the part where the high surface energy part is removed in accordance with the shape (configuration) of the pattern. That is, as shown in FIG. 11D, the wettability changing insulation layer 5 is deposited/formed by having the liquid adhere to the part where the high surface energy part is removed (portion of the removable patterning layer 8 other than the first part A) and solidifying the part to which the liquid adheres.

Subsequent to the process of fabricating the second conductive material layer 7 (as shown in FIG. 11G), a process of applying voltage between the first and second conductive material layers 1 and 7 may be performed. This process can reduce the resistance between the first conductive material layer 1 and the second conductive material layer 7. For example, in a case where there is, for example, residue of the removable patterning layer 8 which could not be thoroughly removed, such residual layer may sometimes create undesired resistance between the first and second conductive material layers 1, 7 and may adversely affect the performance of the electronic device. However, the residual layers can be eliminated by applying the voltage between the first and second conductive material layers 1, 7. The voltage to be applied is preferred to be high voltage to the extent that the electronic device is not damaged.

Accordingly, with the third embodiment of the present invention, at least one of the first conductive material layer 1 and the second conductive material layer 7 can be deposited (formed) by simply applying (coating) a liquid including a conductive material thereto. Therefore, same as the first embodiment of the present invention, the third embodiment of the present invention enables an electronic device to be manufactured with a fewer number of steps compared to a conventional method. Furthermore, an electronic device, which has a fine configuration including a contact hole and a pair of electrodes with an insulation film interposed therebetween, can be easily manufactured.

Same as the first embodiment of the present invention, the method for applying (coating) the conductive material may be, for example, a surface printing method (e.g. flexo printing), a stencil printing method (e.g. screen printing), a surface printing method (e.g. offset printing), or an intaglio printing method (e.g. gravure printing). Accordingly, the cost of the above-described methods for coating (depositing) the conductive material layers is inexpensive compared to vacuum depositing methods such as a vapor deposition method. Furthermore, in a case where one of a spin-coating method, a dipping method, a blade coating method, or a spray coating method is used as the method for applying the liquid including the conductive material, the time for fabricating the electronic device can be reduced. In addition, manufacture cost can also be reduced since such a case requires no printing apparatus. Alternatively, the method for applying the liquid including the conductive material onto the surface of the wettability changing patterns may be an inkjet method. This enables the conductive layers to be formed only on the high surface energy part of, for example, the removable patterning layer 8.

In the third embodiment of the present invention, the low surface energy part 8a of the removable patterning layer 8 is removed during the process of forming the second part B' as shown in FIGS. 1E and 1F. Therefore, the formation of a contact hole and the fabrication of electrodes (wiring electrodes) having an insulation film therebetween can be performed with fewer and easier processes.

Same as the first embodiment of the present invention, an electronic device (including a contact hole 62 and pixel electrode 63 as shown in FIG. 14, for example) obtained by performing the contact hole/electronic device manufacturing method according to the third embodiment of the present invention can be included in a display element such as the above-described liquid crystal display element 61 or the display device 60.

Same as the first embodiment of the present invention, the method for manufacturing an electronic device and the electronic device manufactured by using the method according to the third embodiment of the present invention can be applied to the formation of wiring electrodes and contact holes for connecting transistors (semiconductor elements) and diodes. The transistors (semiconductor elements) and diodes including the electronic device according to the third embodiment of the present invention may be used in, for example, LSI, VLSI, ULSI, a microcomputer, a host computer, a work station, or a personal computer. Accordingly, as described above, an inexpensive semiconductor arithmetic element can be obtained owing to the reduced number of steps for manufacturing the semiconductor arithmetic element.

FOURTH EMBODIMENT

Next, a method of manufacturing an electronic device and a configuration of an electronic device manufactured by the method according to the fourth embodiment of the present invention are described with reference to FIGS. 21A-21H.

First, a first conductive material layer 1 is formed by depositing/forming a first conductive material on a substrate 2 (See FIG. 21A). Then, a patterning layer 10 (in this example, the patterning layer 10 is formed of an insulation material and is hereinafter referred to as insulation material patterning layer 10), which is removable and is formed of a material having a critical surface tension different from that of the first conductive material, is selectively deposited/formed on the first conductive material layer 1 and the substrate 2 (See FIG. 21B). Then, by applying energy (e.g. UV ray) to the insulation material patterning layer 10, a water repellant part 11 is formed at the part where the first conductive material layer 1 electrically contacts a second conductive material layer 7 (described below) (See FIG. 21C). Then, an insulation material layer 12 is formed/deposited on the substrate 2 and the first conductive material layer 1 except for the part on which the water repellent part 11 is provided (See FIG. 21D). Then, a low surface energy layer 13, which is removable by application of energy, is formed on the insulation material layer 12 and the water repellant part 11 (See FIG. 21E). Then, energy (e.g. UV rays) is applied only to a predetermined area of the low surface energy layer 13 including the water repellant part 11 (the area where the second conductive material layer 7 is to be formed) (See FIG. 21F). By applying the energy to the area, the predetermined area of the low surface energy layer 13 including the water repellant part 11 is removed (See FIG. 21G) and a high surface energy part 12b is provided on the insulation material layer 12. Then, the second conductive material layer 7 is formed on the removed area (i.e. contact hole 14) (See FIG. 21H). Thereby, the first conductive material layer 1 and the second conductive material layer 7 are electrically connected at the contact hole 14 in a state where the insulation material layer 12 is disposed therebetween.

Furthermore, it may be said that the above-described method of manufacturing an electronic device according to the fourth embodiment of the present invention (as shown in FIGS. 21A-21H) is also a method of forming a contact hole 14, in which the contact hole 14 formed by the method enables the first conductive material layer 1 and the second conductive material layer 7 to electrically connect only at the predetermined area in a state having the insulation material layer 12 disposed therebetween.

Accordingly, as shown in FIGS. 21A-21H, the electronic device manufactured by the above-described method according to the fourth embodiment of the present invention includes the first conductive material layer 1, the insulation material patterning layer 10 (although in this example, the insulation material patterning layer 10 is already substantially mostly removed and not illustrated in FIGS. 21C-21G) having the water repellant part 11 provided on the first conductive layer 1 and the substrate 2, the insulation material layer 12 provided on the substrate 2 and the first conductive layer 1 except at the part on which the water repellant part 11 is provided, the low surface energy layer 13 provided on the insulation material layer 12, and the second conductive material layer 7 provided on the removed area of the low surface energy layer 13 and the part of the water repellent part 11. In the electronic device according to the fourth embodiment of the present invention, the first conductive material layer 1 and the second conductive material layer 7 are electrically connected at the predetermined area including the water repellant part 11 in a state where the insulation material layer 13 is disposed therebetween.

The method of manufacturing an electronic device and a configuration of an electronic device manufactured by the method according to the fourth embodiment of the present invention is substantially the same as those of the third embodiment of the present invention. One difference between the third and fourth embodiments of the present invention is that the insulation material layer 12 and the low surface energy layer 13 (see FIGS. 21D and 21E) are formed (deposited) instead of the wettability changing insulation layer 5 (see FIG. 11D) in the third embodiment of the present invention.

In a case where a coatable material is used for the insulation material patterning layer 10, the insulation material layer 12 and/or the low surface energy layer 13, the coatable material may be coated (deposited) by, for example, a surface printing method (e.g. flexo printing), a stencil printing method (e.g. screen printing), a surface printing method (e.g. offset printing), or an intaglio printing method (e.g. gravure printing). As for other alternative coating (depositing) methods, there are, for example, a spin-coating method, a blade coating, a dipping method, or a spray-coating method.

Next, the method of manufacturing an electronic device, the configuration of an electronic device manufactured by the manufacturing method, and the method of forming the contact hole according to the fourth embodiment of the present invention are described in more detail (Mainly on the different aspects with respect to the first and third embodiments of the present invention).

Same as the patterning layer 3 shown in FIG. 1B and the removable patterning layer 8 shown in FIG. 11B, the insulation material patterning layer 10 and the low surface energy layer 13 are self-organizing film which do not include an Si element but includes a hydrophobic group. Therefore, the insulation material patterning layer 10 and the low surface energy layer. 13 can be easily and sufficiently removed when energy is applied thereto. This reduces undesired resistance between the first and second conductive material layers 1 and 7 and enables fine patterning of the insulation material layer 12 and the second conductive material layer 7. Details of the "self-organizing film which does not include an Si element but includes a hydrophobic group" are the same as those described in the first and third embodiments of the present invention.

In a case where the insulation material patterning layer 10 and the low surface energy layer 13 are not thoroughly removed, for example, at the area of the contact hole 14, the materials included in the remaining patterning layer and/or the low surface energy layers 10, 13 may generate undesired resistance and adversely affect the conductivity of the electronic device. Accordingly, subsequent to the process of fabricating the second conductive material layer 7 (as shown in FIG. 21H), a process of applying voltage between the first and second conductive material layers 1 and 7 may be performed. This process can reduce the resistance between the first conductive material layer 1 and the second conductive material layer 7. However, even if the insulation material patterning layer 10 and the low surface energy layer 13 are not thoroughly removed, the resistance can be reduced by forming the layers 10, 13 with a significantly small film thickness of several nm.

Same as the wettablility changing insulation layer 5 in the first and third embodiments of the present invention, the solvent used for the insulation material patterning layer 10 includes an organic solvent which can be mixed with water under a predetermined proportion. Therefore, in a case of depositing the insulation material patterning layer 10 onto a layer formed of a material which dissolves in an organic solvent having low polarity, the deposition of the insulation material patterning layer 10 will not damage the layer. Examples of the compounds included in the organic solvent are the same as those described in the first and third embodiments of the present invention. The proportion of the organic solvent with respect to the entire solvent used for depositing/forming the insulation material patterning layer 10 is preferably 30 vol % or more. It is more preferable when the proportion of the organic solvent with respect to the entire solvent used for depositing/forming the insulation material patterning layer 10 is 90% or more.

It is preferred that the difference of critical surface tension between at least the water repellant part 11 and the first conductive material layer 1 to be 10 mN/m or more. It is desired for the difference of surface energy (i.e. the difference of critical surface tension) to be relatively large in order for the liquid containing the insulation material of the insulation material patterning layer 10 to satisfactorily adhere only to the lyophilic high surface energy part (first conductive material layer 1) in accordance to the patterns of the high and low surface energy parts.

The meaning of "critical surface tension" according to the present invention is described above using Young's equation (Equation 1). It is to be noted that reference numeral 2 in FIG. 3 indicates the substrate 2 (e.g. glass substrate).

The below-given Table 3 shows the results of evaluating the selective adherence of polymer (polyaniline) and the difference of critical surface tension $(\Delta \gamma c)$ between the high and low surface energy parts in a case where the materials A, B, C, D (same as those shown in Table 1) are deposited on the glass substrate 2. The selective adherence is evaluated by applying a droplet of polyaniline solution to an area including the pattern interface of the energy exposed part and the energy unexposed part and determining whether there is polyaniline solution still adhered to the energy unexposed part (i.e. pattern failure) after excess solution is removed from the solution applied.

TABLE 3

| Material | $\Delta \gamma c$ (mN/m) | Adherence of Polymer (Polyaniline) |
|---|---|---|
| A | 5 | X |
| B | 10 | ○ |
| C | 15 | ◎ |
| D | 21 | ◎ |

In Table 3, "×" indicates that a large amount of polyaniline is remaining on the low surface energy part (unexposed part), "○" indicates that a small amount of polyaniline is remaining on the low surface energy part (unexposed part), and "◎" indicates that no polyaniline is remaining on the low surface energy part. (unexposed part). Accordingly, the results in Table 3 show that satisfactory patterns can be formed when the difference of the critical surface tension between the high surface energy part and the low surface energy part $(\Delta \gamma c)$ is 10 mN/m or more, and even more satisfactory results can be obtained when the $\Delta \gamma c$ is 15 mN/m or more. In order to achieve such satisfactory results, the material of the first conductive material layer 1, other being a material including a hydrophobic group, is desired to have a high surface energy.

More specifically, other than being a material including a hydrophobic group, the material of the insulation material patterning layer 12 is desired to have a high surface energy, in which the insulation material patterning layer 12 includes, for example, molecules having an active proton (e.g. —OH group, —NH— group) such as PVA (polyvinyl alcohol), PEG (polyethylene glycol), or nylon.

According to the results shown in Table 3, it is desired for the difference of surface energy between the low surface energy layer 13 and the insulation material layer 12 to be 10 mN/m or more. Therefore, the material of the second conductive material layer 7 is able to securely and accurately adhere only to the high surface energy part 12b by making the difference of surface energy between the high surface energy part 12b and the low surface energy part (low surface energy layer 13) large. Furthermore, more satisfactory results adherence can be achieved by making the difference greater than 10 mN/m.

Same as the first and third embodiments of the present invention, the energy preferred to be applied for changing the critical surface tension is a UV (ultraviolet) ray. By using the UV ray, fine patterns can be easily formed. The UV ray is irradiated to the surface of the insulation material patterning layer 10 and the insulation material layer 12 via an exposure mask 4, 6. Thereby, fine patterns of the insulation material patterning layer 10 and the insulation material layer 12 can be formed. It is preferable for the UV ray to have a relatively short wavelength ranging from 100 nm to 300 nm, for example.

The oxygen concentration in the UV irradiation process according to the fourth embodiment of the present invention is set to exceed oxygen concentration in atmospheric air. Therefore, the rate for removing the insulation material patterning layer 10 and the low surface energy layer 13 can be increased. This is due to the acceleration of decomposition by ozone oxidation. Although an oxygen concentration of substantially 100% is preferred, the oxygen concentration may be adjusted in a case where the insulation layer 12 may be damaged by the UV irradiation.

It is particularly preferable to apply the above-described oxygen concentration in the UV irradiation process shown in FIG. 21F. In the UV irradiation process shown in FIG. 21B, the insulation material patterning layer 10 may necessarily be substantially completely removed as shown in FIG. 21C as long as the water repellant part 11 can be formed.

Accordingly, with the fourth embodiment of the present invention, at least one of the first conductive material layer 1 and the second conductive material layer 7 can be deposited (formed) simply by applying (coating) a liquid including a conductive material thereto. Therefore, same as the first and third embodiments of the present invention, the fourth embodiment of the present invention enables an electronic device to be manufactured with a fewer number of steps compared to a conventional method. Furthermore, an electronic device, which has a fine configuration including a contact hole and a pair of electrodes with an insulation film interposed therebetween, can be easily manufactured.

Same as the first and third embodiments of the present invention, the method for applying (coating) the conductive material may be, for example, a surface printing method (e.g. flexo printing), a stencil printing method (e.g. screen printing), a surface printing method (e.g. offset printing), or an intaglio printing method (e.g. gravure printing). Accordingly, the cost of the above-described methods for coating (depositing) the conductive material layers is inexpensive compared to vacuum depositing methods such as a vapor deposition method. Furthermore, in a case where one of a spin-coating method, a dipping method, a blade coating method, or a spray coating method is used as the method for applying the liquid including the conductive material, the time for fabricating the electronic device can be reduced. In addition, manufacture cost can also be reduced since such a case requires no printing apparatus. Alternatively, the method for applying the liquid including the conductive material onto the surface of the wettability changing patterns may be an inkjet method. This enables the conductive layers to be formed only on the high surface energy part of, for example, the insulation material layer 12.

As described above, the distance L between electrodes is becoming smaller as electrode wirings are formed in finer sizes (See FIG. 9A). In some cases, there is a possibility of short-circuit between electrodes during the process of applying the conductive material with a conventional method (See FIG. 9C). However, in applying the conductive material according to the fourth embodiment of the present invention, short-circuit of electrodes can be prevented owing that the conductive material can be applied only to the high surface energy part 12b and thus maintain a sufficient distance L1 between the electrodes by using an inkjet method, for example. Accordingly, with the present invention, fine electrodes and electronic devices can be reliably fabricated.

Although the electronic device manufacturing method (contact hole forming) of the fourth embodiment of the present invention performs the processes forming the insulation material layer 12 and the low surface energy layer 13 in two separate processes (wherein the first and third embodiments of the present invention only perform the process of forming the wettability changing insulation layer 5), a larger variety of materials can be used for forming the insulation material layer 12 and the low surface energy layer 13 compared to the materials that can be used to form the wettability changing insulation layer 5.

Same as the first and third embodiments of the present invention, an electronic device (including a contact hole 62 and pixel electrode 63 as shown in FIG. 14, for example) obtained by performing the contact hole/electronic device manufacturing method according to the fourth embodiment of the present invention can be included in a display element such as the above-described liquid crystal display element 61 or the display device 60.

Same as the first and third embodiments of the present invention, the method for manufacturing an electronic device and the electronic device manufactured by using the method according to the fourth embodiment of the present invention can be applied to the formation of wiring electrodes and contact holes for connecting transistors (semiconductor elements) and diodes. The transistors (semiconductor elements) and diodes including the electronic device according to the fourth embodiment of the present invention may be used in, for example, LSI, VLSI, ULSI, a microcomputer, a host computer, a work station, or a personal computer. Accordingly, as described above, an inexpensive semiconductor arithmetic element can be obtained owing to the reduced number of steps for manufacturing the semiconductor arithmetic element.

Further, the present invention is not limited to these embodiments, but variations and modifications may be made without departing from the scope of the present invention.

The present application is based on Japanese Priority Application Nos. 2004-202277 and 2005-001771 filed on Jul. 8, 2004 and Jan. 6, 2005, respectively, with the Japanese Patent Office, the entire contents of which are hereby incorporated by reference.

What is claimed is:

1. An electronic device comprising:
   a substrate;
   a first conductive material layer formed on the substrate;
   a patterning layer formed on the first conductive material layer, the patterning layer including first and second patterning layer parts having different critical surface tensions;
   an insulation layer formed on the second patterning layer part of the patterning layer, the insulation layer including first and second insulation layer parts having different critical surface tensions; and
   a second conductive material layer formed on the first patterning layer part and the first insulation layer part.

2. The electronic device as claimed in claim 1, wherein the patterning layer is a self-organizing film.

3. The electronic device as claimed in claim 1, wherein at least one of the patterning layer and the insulation layer is formed of a material including an organic solvent mixed with water under a predetermined proportion.

4. The electronic device as claimed in claim 1, wherein the critical surface tension of the first patterning layer part is smaller than the critical surface tension of the second patterning layer part, and the difference of the critical surface tensions of the first patterning layer part and the second patterning layer part is 10 mN/m or more.

5. The electronic device as claimed in claim 1, wherein the critical surface tension of the first insulation layer part is smaller than the critical surface tension of the second insulation layer part, and the difference of the critical surface tensions of the first insulation layer part and the second insulation layer part is 10 mN/m or more.

6. The electronic device as claimed in claim 1, wherein the insulation layer includes at least first and second characteristic materials having different characteristics.

7. The electronic device as claimed in claim 6, wherein when energy is applied to the insulation layer, a change of the critical surface tension of the first characteristic material is greater than a change of the critical surface tension of the second characteristic material and the second characteristic material has a greater insulation property than that of the first characteristic material.

8. The electronic device as claimed in claim 7, wherein when energy is applied to the insulation layer, the change of the critical surface tension of the first characteristic material is greater than the change of the critical surface tension of the second characteristic material and the second characteristic material has a lower dielectric constant than that of the first characteristic material.

9. The electronic device as claimed in claim 1, wherein the insulation layer includes a polymer material having a side-chain that includes a hydrophobic group.

10. The electronic device as claimed in claim 9, wherein the polymer material includes polyimide.

11. A display element comprising:
    the electronic device as claimed in claim 1.

12. A display device comprising:
    the display element as claimed in claim 11.

13. A semiconductor arithmetic element comprising:
    the electronic device as claimed in claim 1.

14. A computer comprising:
    the electronic device as claimed in claim 1.

15. A method of manufacturing an electronic device, the method comprising the steps of:
    forming a first conductive material layer on a substrate;
    forming a patterning layer on the first conductive material layer by applying a first coating material to the first conductive material layer;
    forming first and second patterning layer parts having different critical surface tensions in the patterning layer, the first and second patterning layer parts in the patterning layer being formed by applying energy to the patterning layer;
    forming an insulation layer on the first conductive material layer by applying a second coating material to the patterning layer;
    forming first and second insulation layer parts having different critical surface tensions in the insulation layer, the first and second insulation layer parts in the insulation layer being formed by applying the energy to the insulation layer; and
    forming a second conductive material layer on the first patterning layer part and the first insulation layer part.

16. The method for manufacturing an electronic device as claimed in claim 15, further comprising a step of
    applying voltage between the first and second conductive material layers after the forming the second conductive material layer.

17. The method for manufacturing an electronic device as claimed in claim 15, wherein the application of energy includes irradiation of a UV ray.

18. The method for manufacturing an electronic device as claimed in claim 15, wherein at least one of the first and second conductive material layers is formed by applying a liquid coating containing a conductive material.

19. The method for manufacturing an electronic device as claimed in claim 18, wherein the application of the liquid coating containing a conductive material is performed by using a spin-coating method, a blade coating, a dipping method, or a spray-coating method.

20. The method for manufacturing an electronic device as claimed in claim 18, wherein the application of the liquid coating containing a conductive material is performed by using an inkjet method.

21. A method of forming a contact hole for an electronic device, the method comprising the steps of:
    forming a first conductive material layer on a substrate;
    forming a patterning layer on the first conductive material layer by applying a first coating material to the first conductive material layer;
    forming first and second patterning layer parts having different critical surface tensions in the patterning layer, the first and second patterning layer parts in the patterning layer being formed by applying energy to the patterning layer;
    forming an insulation layer on the first conductive material layer by applying a second coating material to the patterning layer; and
    forming first and second insulation layer parts having different critical surface tensions in the insulation layer, the first and second insulation layer parts in the insulation layer being formed by applying the energy to the insulation layer.

22. A contact hole of an electronic device, the contact hole formed by a process comprising the steps of:
    forming a first conductive material layer on a substrate;
    forming a patterning layer on the first conductive material layer by applying a first coating material to the first conductive material layer;

forming first and second patterning layer parts having different critical surface tensions in the patterning layer, the first and second patterning layer parts in the patterning layer being formed by applying energy to the patterning layer;

forming an insulation layer on the first conductive material layer by applying a second coating material to the patterning layer; and forming first and second insulation layer parts having different critical surface tensions in the insulation layer, the first and second insulation layer parts in the insulation layer being formed by applying the energy to the insulation layer.

23. An electronic device comprising:
a substrate;
a first conductive material layer formed on a substrate;
a removable patterning layer formed on the first conductive material layer, the removable patterning layer including a removable patterning layer part having a critical surface tension different from that of the first conductive material layer;
an insulation layer formed on the first conductive material layer except for a part of the first conductive material layer on which the removable patterning layer part is formed, the insulation layer including first and second insulation layer parts having different critical surface tensions; and
a second conductive material layer formed on the removable patterning layer part and the first insulation layer part.

24. The electronic device as claimed in claim 23, wherein the removable patterning layer is a self-organizing film.

25. The electronic device as claimed in claim 23, wherein at least one of the removable patterning layer and the insulation layer is formed of a material including an organic solvent mixed with water under a predetermined proportion.

26. The electronic device as claimed in claim 23, wherein the critical surface tension of the removable patterning layer part is smaller than the critical surface tension of the first conductive material layer, and the difference of the critical surface tensions of the removable patterning layer part and the first conductive material layer is 10 mN/m or more.

27. The electronic device as claimed in claim 23, wherein the critical surface tension of the first insulation layer part is smaller than the critical surface tension of the second insulation layer part, and the difference of the critical surface tensions of the first insulation layer part and the second insulation layer part is 10 mN/m or more.

28. The electronic device as claimed in claim 23, wherein the insulation layer includes at least first and second characteristic materials having different characteristics.

29. The electronic device as claimed in claim 28, wherein when energy is applied to the insulation layer, a change of the critical surface tension of the first characteristic material is greater than a change of the critical surface tension of the second characteristic material and the second characteristic material has a greater insulation property than that of the first characteristic material.

30. The electronic device as claimed in claim 28, wherein when energy is applied to the insulation layer, the change of the critical surface tension of the first characteristic material is greater than the change of the critical surface tension of the second characteristic material and the second characteristic material has a lower dielectric constant than that of the first characteristic material.

31. The electronic device as claimed in claim 23, wherein the insulation layer includes a polymer material having a side-chain that includes a hydrophobic group.

32. The electronic device as claimed in claim 31, wherein the polymer material includes polyimide.

33. A display element comprising:
the electronic device as claimed in claim 23.

34. A display device comprising:
the display element as claimed in claim 33.

35. A semiconductor arithmetic element comprising:
the electronic device as claimed in claim 23.

36. A computer comprising:
the semiconductor arithmetic element as claimed in claim 35.

37. A method of manufacturing an electronic device, the method comprising the steps of:
forming a first conductive material layer on a substrate;
forming a removable patterning layer on the first conductive material layer by applying a first coating material to the first conductive material layer;
forming a removable patterning layer part in the removable patterning layer by applying energy to the removable patterning layer, the removable patterning layer part having a critical surface tension different from that of the first conductive material layer;
forming an insulation layer on the first conductive material layer except for a part of the first conductive material layer on which the removable patterning layer part is formed by applying a second coating material to the first conductive material layer;
removing the removable patterning layer part and forming first and second insulation layer parts in the insulation layer by applying the energy to the removable patterning layer part and the insulation layer, the first and second insulation layer parts having different critical surface tensions; and
forming a second conductive material layer on the first conductive material layer and the first insulation layer part.

38. The method for manufacturing an electronic device as claimed in claim 37, further comprising a step of applying voltage between the first and second conductive material layers after the forming the second conductive material layer.

39. The method for manufacturing an electronic device as claimed in claim 37, wherein the application of energy includes irradiation of a UV ray.

40. The method for manufacturing an electronic device as claimed in claim 37, wherein at least one of the first and second conductive material layers is formed by applying a liquid coating containing a conductive material.

41. The method for manufacturing an electronic device as claimed in claim 40, wherein the application of the liquid coating containing a conductive material is performed by using a spin-coating method, a blade coating, a dipping method, or a spray-coating method.

42. The method for manufacturing an electronic device as claimed in claim 40, wherein the application of the liquid coating containing a conductive material is performed by using an inkjet method.

43. A method for forming a contact hole for an electronic device, the method comprising the steps of:
forming a first conductive material layer on a substrate;
forming a removable patterning layer on the first conductive material layer by applying a first coating material to the first conductive material layer;
forming a removable patterning layer part in the removable patterning layer by applying energy to the removable patterning layer, the removable patterning layer part having a critical surface tension different from that of the first conductive material layer;

forming an insulation layer on the first conductive material layer except for a part of the first conductive material layer on which the removable patterning layer part is formed by applying a second coating material to the first conductive material layer; and removing the removable patterning layer part and forming first and second insulation layer parts in the insulation layer by applying the energy to the removable patterning layer part and the insulation layer, the first and second insulation layer parts having different critical surface tensions.

44. A contact hole of an electronic device formed by a process comprising the steps of:

forming a first conductive material layer on a substrate;

forming a removable patterning layer on the first conductive material layer by applying a first coating material to the first conductive material layer;

forming a removable patterning layer part in the removable patterning layer by applying energy to the removable patterning layer, the removable patterning layer part having a critical surface tension different from that of the first conductive material layer;

forming an insulation layer on the first conductive material layer except for a part of the first conductive material layer on which the removable patterning layer part is formed by applying a second coating material to the first conductive material layer; and removing the removable patterning layer part and forming first and second insulation layer parts in the insulation layer by applying the energy to the removable patterning layer part and the insulation layer, the first and second insulation layer parts having different critical surface tensions.

45. An electronic device comprising:

a substrate;

a first conductive material layer formed on a substrate;

a removable patterning layer formed on the first conductive material layer, the patterning layer including a removable patterning layer part having a critical surface tension different from that of the first conductive material layer;

an insulation layer formed on the first conductive material layer except for a part of the first conductive material layer on which the removable patterning layer part is formed;

a low surface energy layer formed on the insulation layer and the removable layer part, the low surface energy layer including a target removal area; and a second conductive material layer formed on a predetermined area of the removable patterning layer part and the insulation layer that corresponds to the target removal area of the low surface energy layer.

46. The electronic device as claimed in claim 45, wherein the removable patterning layer includes an insulation material patterning layer, and the removable patterning layer part includes a water repellant part.

47. The electronic device as claimed in claim 45, wherein the removable patterning layer and the low surface energy layer are formed of a material including a self-organizing film which does not include an Si element but includes a hydrophobic group.

48. The electronic device as claimed in claim 45, wherein the removable pattering layer is formed of a material including an organic solvent mixed with water under a predetermined proportion.

49. The electronic device as claimed in claim 45, wherein the difference of surface energy between the removable patterning layer part and the first conductive layer is 10 mn/m or more.

50. The electronic device as claimed in claim 45, wherein the difference of surface energy between the low surface energy layer and the insulation layer is 10 mn/m or more.

51. A display element comprising:

the electronic device as claimed in claim 45.

52. A display device comprising:

the display element as claimed in claim 51.

53. A semiconductor arithmetic element comprising:

the electronic device as claimed in claim 45.

54. A computer comprising:

the semiconductor arithmetic element as claimed in claim 53.

55. A method of manufacturing an electronic device, the method comprising the steps of:

forming a first conductive material layer on a substrate;

forming a removable patterning layer on the first conductive material layer by applying a first coating material to the first conductive material layer;

forming a removable patterning layer part in the removable patterning layer by applying energy to the removable patterning layer, the removable patterning layer part having a critical surface tension different from that of the first conductive material layer;

forming an insulation layer on the first conductive material layer except for a part of the first conductive material layer on which the removable patterning layer part is formed by applying a second coating material to the first conductive material layer;

forming a low surface energy part on the insulation layer and the removable patterning layer part, the low surface energy part including a target removal area;

removing the removable patterning layer part and the target removal area by applying the energy to the removable patterning layer part and the target removal area; and forming a second conductive material layer on a predetermined area of the removable patterning layer part and the insulation layer that corresponds to the target removal area of the low surface energy layer.

56. The method for manufacturing an electronic device as claimed in claim 55, further comprising a step of applying voltage between the first and second conductive material layers after the forming the second conductive material layer.

57. The method for manufacturing an electronic device as claimed in claim 55, wherein the application of energy includes irradiation of a UV ray.

58. The method for manufacturing an electronic device as claimed in claim 57, wherein the oxygen concentration in the UV irradiation process is set to exceed oxygen concentration in atmospheric air.

59. The method for manufacturing an electronic device as claimed in claim 55, wherein at least one of the first and second conductive material layers is formed by applying a liquid coating containing a conductive material.

60. The method for manufacturing an electronic device as claimed in claim 59, wherein the application of the liquid coating containing a conductive material is performed by using a spin-coating method, a blade coating, a dipping method, or a spray-coating method.

61. The method for manufacturing an electronic device as claimed in claim 59, wherein the application of the liquid coating containing a conductive material is performed by using an inkjet method.

62. A method for forming a contact hole for an electronic device, the method comprising the steps of:

forming a first conductive material layer on a substrate;

forming a removable patterning layer on the first conductive material layer by applying a first coating material to the first conductive material layer;

forming a removable patterning layer part in the removable patterning layer by applying energy to the removable patterning layer, the removable patterning layer part having a critical surface tension different from that of the first conductive material layer;

forming an insulation layer on the first conductive material layer except for a part of the first conductive material layer on which the removable patterning layer part is formed by applying a second coating material to the first conductive material layer;

forming a low surface energy part on the insulation layer and the removable patterning layer part, the low surface energy part including a target removal area; and removing the removable patterning layer part and the target removal area by applying the energy to the removable patterning layer part and the target removal area.

63. A contact hole of an electronic device formed by a process comprising the steps of:

forming a first conductive material layer on a substrate;

forming a removable patterning layer on the first conductive material layer by applying a first coating material to the first conductive material layer;

forming a removable patterning layer part in the removable patterning layer by applying energy to the removable patterning layer, the removable patterning layer part having a critical surface tension different from that of the first conductive material layer;

forming an insulation layer on the first conductive material layer except for a part of the first conductive material layer on which the removable patterning layer part is formed by applying a second coating material to the first conductive material layer;

forming a low surface energy part on the insulation layer and the removable patterning layer part, the low surface energy part including a target removal area;

removing the removable patterning layer part and the target removal area by applying the energy to the removable patterning layer part and the target removal area; and forming a second conductive material layer on a predetermined area of the removable patterning layer part and the insulation layer that corresponds to the target removal area of the low surface energy layer.

\* \* \* \* \*